(12) United States Patent
Luo

(10) Patent No.: US 11,616,614 B2
(45) Date of Patent: *Mar. 28, 2023

(54) USAGE OF SYNCHRONIZATION SIGNAL BLOCK INDEX IN NEW RADIO

(71) Applicant: QUALCOMM Incorporated, San Diego, CA (US)

(72) Inventor: Tao Luo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 17/325,073

(22) Filed: May 19, 2021

(65) Prior Publication Data

US 2021/0329638 A1 Oct. 21, 2021

Related U.S. Application Data

(63) Continuation of application No. 16/592,430, filed on Oct. 3, 2019, now Pat. No. 11,057,893, which is a
(Continued)

(51) Int. Cl.
*H04W 52/02* (2009.01)
*H04L 5/00* (2006.01)
(Continued)

(52) U.S. Cl.
CPC ............ *H04L 5/0044* (2013.01); *H04L 5/005* (2013.01); *H04L 5/0053* (2013.01);
(Continued)

(58) Field of Classification Search
None
See application file for complete search history.

(56) References Cited

U.S. PATENT DOCUMENTS

| 4,817,148 A | 3/1989 | Lafferty et al. |
|---|---|---|
| 8,289,946 B2 | 10/2012 | Luo et al. |

(Continued)

FOREIGN PATENT DOCUMENTS

| CN | 103002561 A | 3/2013 |
|---|---|---|
| CN | 103444145 A | 12/2013 |

(Continued)

OTHER PUBLICATIONS

European Search Report—EP21198251—Search Authority—The Hague—dated Jan. 27, 2022.
(Continued)

*Primary Examiner* — Sithu Ko
(74) *Attorney, Agent, or Firm* — Nerrie M. Zohn

(57) ABSTRACT

A base station may determine an SS block index associated with an SS block for transmission, and may scramble information based on at least a portion of the determined SS block index. The information may include at least one of a reference signal, data, paging information, control information, broadcast information, or a CRC associated with control information. The base station may transmit the SS block and scrambled information to a UE. A UE may receive an SS block and information scrambled based on at least a portion of an SS block index associated with the SS block. The information may include at least one of a reference signal, data, paging information, control information, broadcast information, or a CRC associated with control information. The UE may descramble the scrambled information based on the at least the portion of the SS block index.

38 Claims, 14 Drawing Sheets

Related U.S. Application Data continuation of application No. 15/802,387, filed on Nov. 2, 2017, now Pat. No. 10,568,102.

(60) Provisional application No. 62/462,872, filed on Feb. 23, 2017.

(51) Int. Cl.
*H04W 72/044* (2023.01)
*H04L 27/26* (2006.01)
*H04W 56/00* (2009.01)
*H04L 25/03* (2006.01)
*H04W 76/10* (2018.01)
*H03M 13/09* (2006.01)

(52) U.S. Cl.
CPC ...... *H04L 5/0055* (2013.01); *H04L 25/03866* (2013.01); *H04L 27/2613* (2013.01); *H04L 27/2617* (2013.01); *H04L 27/2662* (2013.01); *H04W 56/00* (2013.01); *H04W 72/0466* (2013.01); *H04W 76/10* (2018.02); *H03M 13/09* (2013.01); *H04L 5/001* (2013.01); *H04L 27/26136* (2021.01)

(56) References Cited

U.S. PATENT DOCUMENTS

| | | | |
|---|---|---|---|
| 8,885,740 B2* | 11/2014 | Zhang | H04L 27/2602 455/45 |
| 8,982,911 B2 | 3/2015 | Chang et al. | |
| 9,485,661 B2* | 11/2016 | Gorokhov | H04W 16/02 |
| 9,729,299 B2* | 8/2017 | Barriac | H04L 5/0005 |
| 10,389,567 B2 | 8/2019 | Si et al. | |
| 10,498,481 B2 | 12/2019 | Wu et al. | |
| 10,531,494 B2 | 1/2020 | Maaref | |
| 10,568,102 B2 | 2/2020 | Luo | |
| 10,582,504 B2 | 3/2020 | Luo | |
| 10,638,436 B2* | 4/2020 | Park | H04W 72/005 |
| 10,979,265 B2 | 4/2021 | Yi | |
| 11,057,893 B2 | 7/2021 | Luo | |
| 11,122,529 B2* | 9/2021 | Park | H04L 25/03866 |
| 2008/0273522 A1 | 11/2008 | Luo et al. | |
| 2009/0135803 A1* | 5/2009 | Luo | H04L 5/0023 380/268 |
| 2012/0327871 A1* | 12/2012 | Ghosh | H04L 1/0041 370/329 |
| 2013/0163554 A1* | 6/2013 | Morozov | H04B 7/0417 370/329 |
| 2013/0308524 A1* | 11/2013 | Tavildar | H04W 72/1242 370/328 |
| 2013/0308555 A1 | 11/2013 | Ho et al. | |
| 2014/0161043 A1 | 6/2014 | Luo et al. | |
| 2014/0169316 A1 | 6/2014 | Kim et al. | |
| 2015/0063255 A1* | 3/2015 | Tandra | H04J 11/0023 370/329 |
| 2015/0078348 A1 | 3/2015 | Han et al. | |
| 2015/0237654 A1* | 8/2015 | Park | H04W 74/0816 370/329 |
| 2015/0305041 A1 | 10/2015 | Kim | |
| 2016/0192335 A1 | 6/2016 | Kusashima et al. | |
| 2016/0227526 A1 | 8/2016 | Park et al. | |
| 2016/0234762 A1 | 8/2016 | You et al. | |
| 2016/0366669 A1 | 12/2016 | Yum et al. | |
| 2017/0223667 A1 | 8/2017 | Yi et al. | |
| 2017/0279553 A1 | 9/2017 | Sadiq et al. | |
| 2018/0084593 A1 | 3/2018 | Chen et al. | |
| 2018/0139084 A1 | 5/2018 | Jung et al. | |
| 2018/0198659 A1 | 7/2018 | Ko et al. | |
| 2018/0295007 A1 | 10/2018 | Kumar et al. | |
| 2019/0007933 A1 | 1/2019 | Yi et al. | |
| 2019/0081827 A1 | 3/2019 | Ly et al. | |
| 2019/0238270 A1 | 8/2019 | Pan et al. | |
| 2019/0281534 A1 | 9/2019 | Yu et al. | |
| 2019/0335470 A1* | 10/2019 | Si | H04L 1/0061 |
| 2019/0342896 A1* | 11/2019 | Kusashima | H04W 72/042 |
| 2020/0404617 A1 | 12/2020 | Murray et al. | |

FOREIGN PATENT DOCUMENTS

| | | |
|---|---|---|
| CN | 104219757 A | 12/2014 |
| CN | 106105085 A | 11/2016 |
| EP | 3032904 A1 | 6/2016 |
| EP | 3096476 A1 | 11/2016 |
| WO | 2015163634 A1 | 10/2015 |

OTHER PUBLICATIONS

Qualcomm Incorporated: "PBCH Design Considerations", 3GPP TSG-RAN WG1 #88, R1-1702589, Athens, Greece, Feb. 13-17, 2017, 9 Pages, Feb. 6, 2017.
3GPP TS 36.211: "3rd Generation Partnership Project; Technical Specification Group Radio Access Network; Evolved Universal Terrestrial Radio Access (E-UTRA); Physical channels and Modulation (Release 14) (Draft36211-e10_s00-s05)", V14.1.0 (Dec. 2016), 3GPP standard; 3rd Generation Partnership Project (3GPP), Mobile Competence Centre; 650, Route Des Lucioles; F-06921 Sophia-Antipolis Cedex; France, vol. RAN WG1, No. V14.1.0, Jan. 2, 2017, pp. 8-68, XP051230333, [retrieved on Jan. 2, 2017].
Ericsson: "Basic Access Configuration Acquisition Principles for NR", 3GPP TSG-RAN WG2 #96 Tdoc, R2-168298, Reno, Nevada, USA, Nov. 14-18, 2016, 2 Pages.
Huawei., et al., "NR Primary and Secondary Synchronization Signals Design", 3GPP TSG RAN WG1 Meeting #87, R1-1611261, Reno, USA, Nov. 14-18, 2016, 10 pages.
Huawei, et al., "Synchronization Signal Design in NR", 3GPP TSG RAN WG1 Meeting #86bis, 3GPP Draft, R1-1608846, 3GPP TSG RAN WG1 Meeting #86bis, 3rd Generation Partnership Project (3GPP), Mobile Competence Centre, 650, Route Des Lucioles, F-06921 Sophia-Antipolis Cedex, France, vol. RAN WG1, No. Lisbon, Portugal, Oct. 10-Oct. 14, 2016, pp. 1-5, Oct. 9, 2016 (Oct. 9, 2016), XP051148900, Retrieved from the Internet: URL: http://www.3gpp.org/ftp/Meetings_3GPP_SYNC/RAN1/Docs/ [retrieved on Oct. 9, 2016] p. 2, paragraph 8, table 1.
International Search Report and Written Opinion—PCT/US2018/015286—ISA/EPO—dated May 3, 2018.
Nokia, et al., "Beam Management—QCL Association Between DL RS and DMRS for NR-PDCCH", 3GPP Draft, 3GPP TSG RAN WG1 #88, R1-1703166, 3rd Generation Partnership Project (3GPP), Mobile Competence Centre, 650, Route Des Lucioles, F-06921 Sophia-Antipolis Cedex, France, vol. RAN WG1, No. Athens, Greece, Feb. 13-Feb. 17, 2017 Feb. 12, 2017 (Feb. 12, 2017), XP051210302, 4 Pages, Retrieved from the Internet: URL:http://www.3gpp.org/ftp/Meetings_3GPP_SYNC/RAN1/Docs/ [retrieved on Feb. 12, 2017].
NTT DOCOMO, Inc. (Rapporteur), et al., "RAN WG's Progress on NR Technology SI in the January Ad-Hoc Meeting", 3GPP Draft, 3GPP TSG-RAN WG2 #97, R2-1701059, 3rd Generation Partnership Project (3GPP), Mobile Competence Centre, 650, Route Des Lucioles, F-06921 Sophia-Antipolis Cedex, France, vol. RAN WG2, No. Athens, Greece, Feb. 13-Feb. 17, 2017 Feb. 12, 2017, XP051211790, pp. 1-38, Retrieved from the Internet: URL:http://www.3gpp.org/ftp/Meetings_3GPP_SYNC/RAN2/Docs/ [retrieved on Feb. 12, 2017].
Qualcomm Incorporated: "SS Burst Composition and Time Index Indication Considerations", 3GPP Draft, 3GPP TSG-RAN WG1 NR #88, R1-1702585, 3rd Generation Partnership Project (3GPP), Mobile Competence Centre, 650, Route Des Lucioles, F-06921 Sophia-Anti, vol. RAN WG1, No. Athens, Greece, Feb. 13-Feb. 17, 2017, Feb. 12, 2017 (Feb. 12, 2017), XP051209739, pp. 1-6, Retrieved from the Internet URL: http://www.3gpp.org/ftp/Meetings_3GPP_SYNC/RAN1/Docs/.
Sequans Communications: "Discussion on Synchronization Procedure in NR", 3GPP Draft; 3GPP TSG RAN WG1 #88, R1-1701850—SS Time Index Indication in NR Synch, 3rd Generation Partnership Project (3GPP), Mobile Competence Centre, 659, Route Des Lucioles, F-06921, Sophia-Antipolis Cedex; France, vol. RAN WG1, No. Athens, Greece; Feb. 13-Feb. 17, 2017, Feb. 12, 2017 (Feb. 12,

(56) References Cited

OTHER PUBLICATIONS

2017), 6 pages, XP051209015,20170206, Retrieved from the Internet: URL: http://www.3gpp.org/ftp/Meetings_3GPP_SYNC/RAN1/Docs/.

ZTE., et al., "Design of SS Burst Set and SS Block Index", 3GPP TSG RAN WG1 Meeting #88, R1-1701573, Athens, Greece Feb. 13-17, 2017, 5 Pages.

Fujitsu, "Consideration on SS Block Time Index Indication", R1-1707252, 3GPP TSG RAN WG1 #89, 3GPP, Hangzhou, P.R. China May 15-19, 2017, Sever Release Date (May 5, 2017), 4 Pages.

Lenovo, et al., "Discussion on RMSI Delivery", R1-1712684, 3GPP TSG RAN WG1 #90, 3GPP, Sever Release Date (Aug. 11, 2017), Prague, P. R. Czechia, Aug. 21-25, 2017, 3 Pages.

Qualcomm Incorporated: "Pbch Design Considerations", 3GPP Draft, 3GPP Tsg-Ran WG1 Nr AdHoc, R1-1700788, Pbch Design Considerations, 3RD Generation Partnership Project (3GPP), Mobile Competence Centre, 650, Route Des Lucioles, F-06921, Sophia-Antipolis Cedex, France, vol. RAN WG1. No. Spokane. USA, Jan. 16, 2017-Jan. 20, 2017, Jan. 16, 2017 (Jan. 16, 2017), XP051208309, pp. 1-6, Section 2.3, PBCH redundancy versions and SS block timing indication, pp. 3-4.

ZTE: "NR-PBCH DMRS: Design and Time Index Indication", R1-1712060, 3GPP TSG RAN WG1 #90, 3GPP, Sever Release Date (Aug. 11, 2017), Prague, Czechia, Aug. 21-25, 2017, 16 Pages.

\* cited by examiner

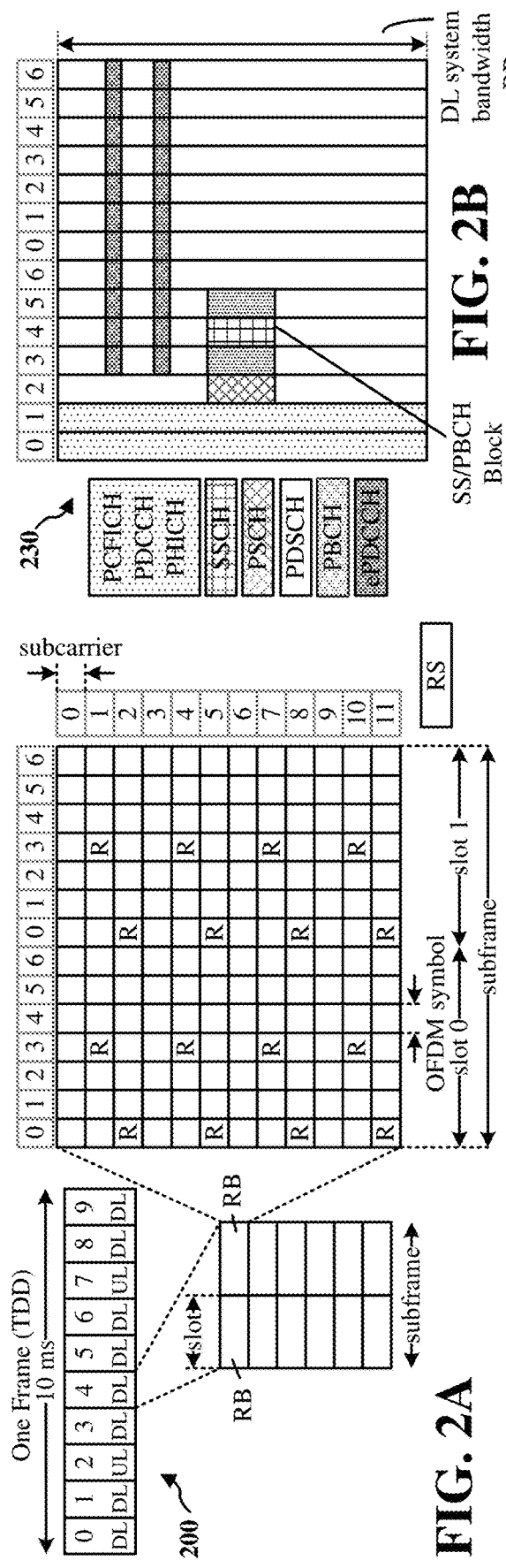
FIG. 2A
FIG. 2B
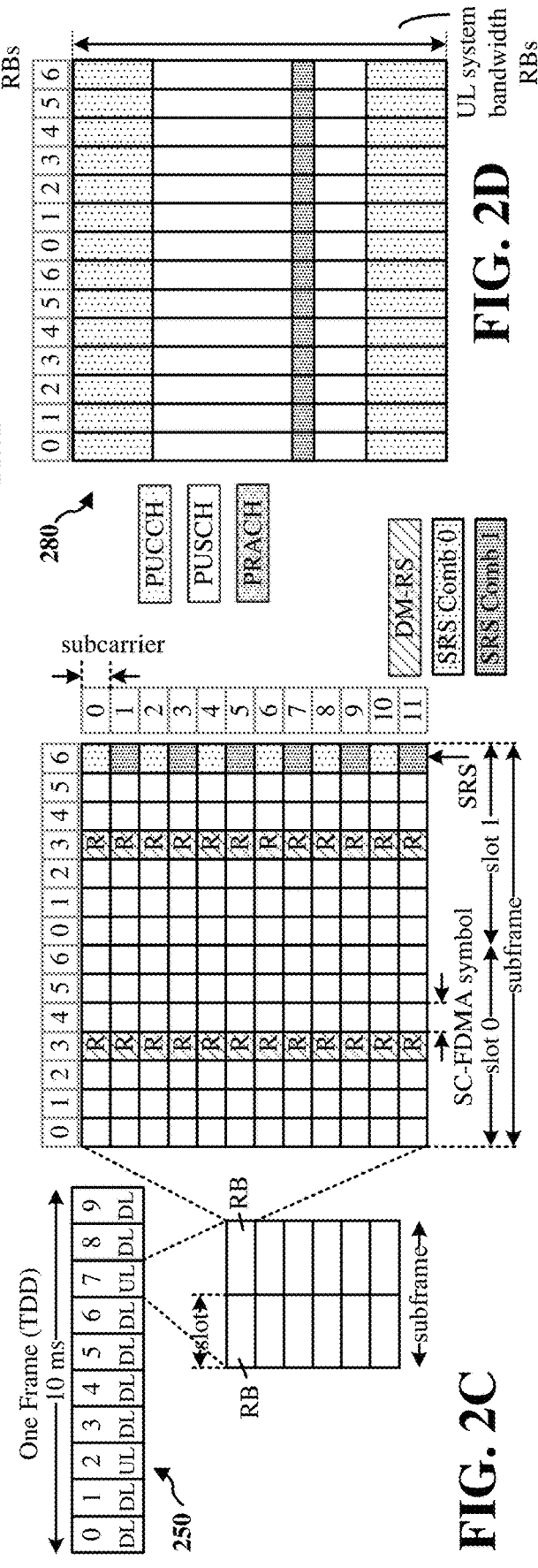
FIG. 2C
FIG. 2D

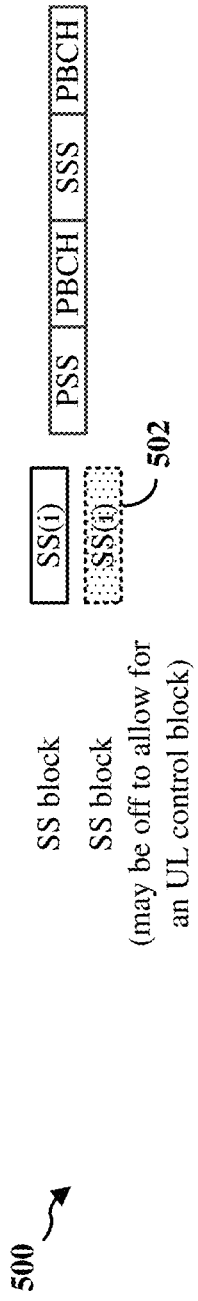
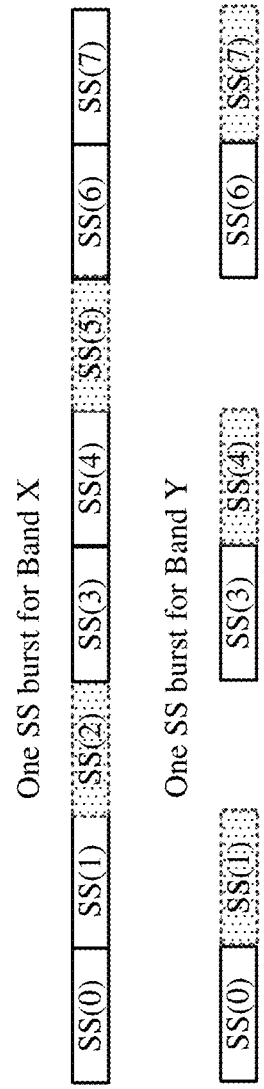
FIG. 5A
FIG. 5B

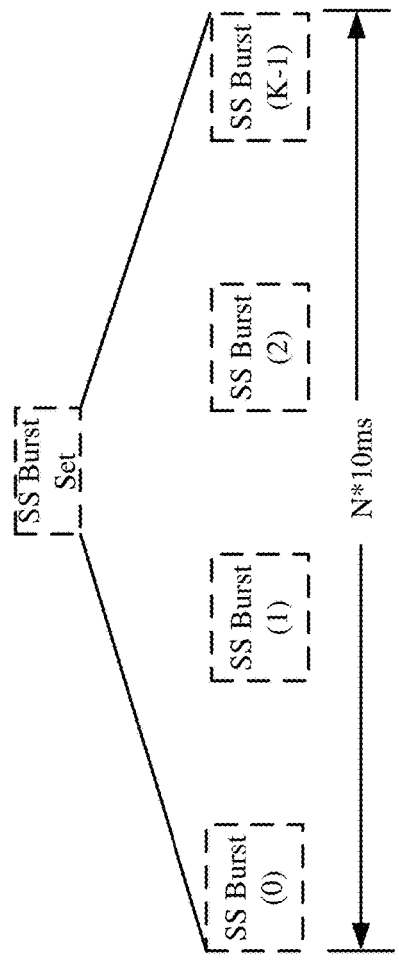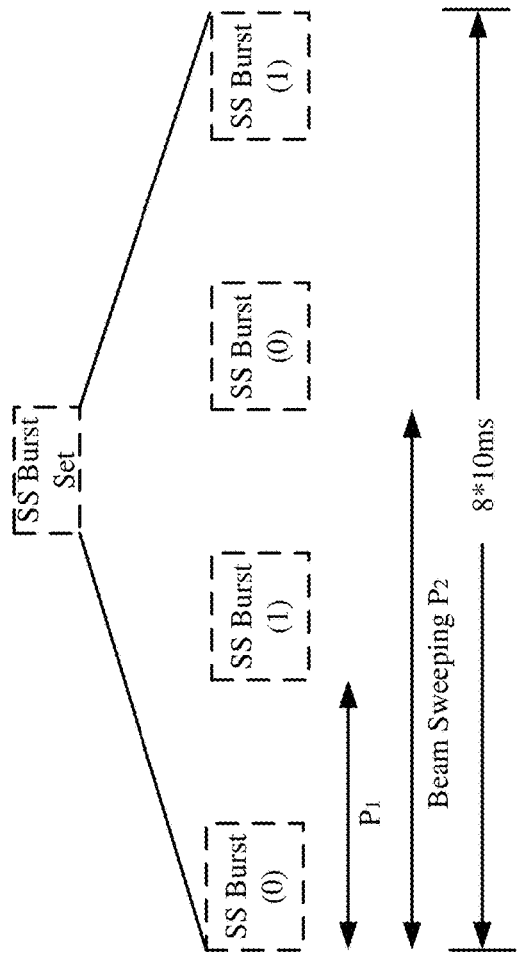

USAGE OF SYNCHRONIZATION SIGNAL BLOCK INDEX IN NEW RADIO

CROSS-REFERENCE TO RELATED APPLICATION(S)

This present application for Patent is a Continuation application of U.S. patent application Ser. No. 16/592,430 entitled "USAGE OF SYNCHRONIZATION SIGNAL BLOCK INDEX IN NEW RADIO" filed on Oct. 3, 2019 which application claims the benefit of Continuation application of U.S. patent application Ser. No. 15/802,387 entitled "USAGE OF SYNCHRONIZATION SIGNAL BLOCK INDEX IN NEW RADIO" filed Nov. 2, 2017 which application claims the benefit of U.S. Provisional Application Ser. No. 62/462,872, entitled "USAGE OF SYNCHRONIZATION SIGNAL BLOCK INDEX IN NEW RADIO" and filed on Feb. 23, 2017, which is expressly incorporated by reference herein in its entirety.

BACKGROUND

Technical Field

The present disclosure relates generally to communication systems, and more particularly, to usage of a synchronization signal block index for scrambling.

Introduction

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the disclosure provide for a base station/user equipment (UE) that scramble/descramble information based on at least a portion of an SS block index, where the SS block index indexes a particular SS block within an SS burst within an SS burst set. The information may be scrambled before being transmitted or may be descrambled after being received.

In an aspect of the disclosure, a method, a computer-readable medium, and an apparatus are provided. In one aspect, the apparatus may be a base station. The base station determines a synchronization signal (SS) block index associated with an SS block for transmission. The base station scrambles information based on at least a portion of the determined SS block index. The information includes at least one of a reference signal, data, paging information, control information, broadcast information, or a cyclic redundancy check (CRC) associated with control information. The base station transmits the SS block and the scrambled information.

In one aspect, the apparatus may be a base station. The base station receives, from a UE, information scrambled based on at least a portion of an SS block index. The scrambled information includes at least one of data or control information. The base station descrambles the scrambled information based on the at least the portion of the SS block index.

In one aspect, the apparatus may be a UE. The UE receives an SS block and information scrambled based on at least a portion of an SS block index associated with the SS block. The information includes at least one of a reference signal, data, paging information, control information, broadcast information, or a CRC associated with control information. The UE descrambles the scrambled information based on the at least the portion of the SS block index.

In one aspect, the apparatus may be a UE. The UE determines an SS block index associated with an SS block for reception. The UE scrambles information based on at least a portion of the determined SS block index. The information includes at least one of data, control information, or a CRC associated with control information. The UE transmits the scrambled information to a base station.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 2A, 2B, 2C, and 2D are diagrams illustrating examples of a DL subframe, DL channels within the DL subframe, an UL subframe, and UL channels within the UL subframe, respectively, for a 5G/NR frame structure.

FIG. 5A is a diagram illustrating an example of an SS burst.

FIG. 5B is a diagram illustrating an example of SS bursts for different frequency bands/carriers.

FIG. 6A is a diagram illustrating a first example of an SS burst set.

FIG. 6B is a diagram illustrating a second example of an SS burst set.

DETAILED DESCRIPTION

Figure 1:
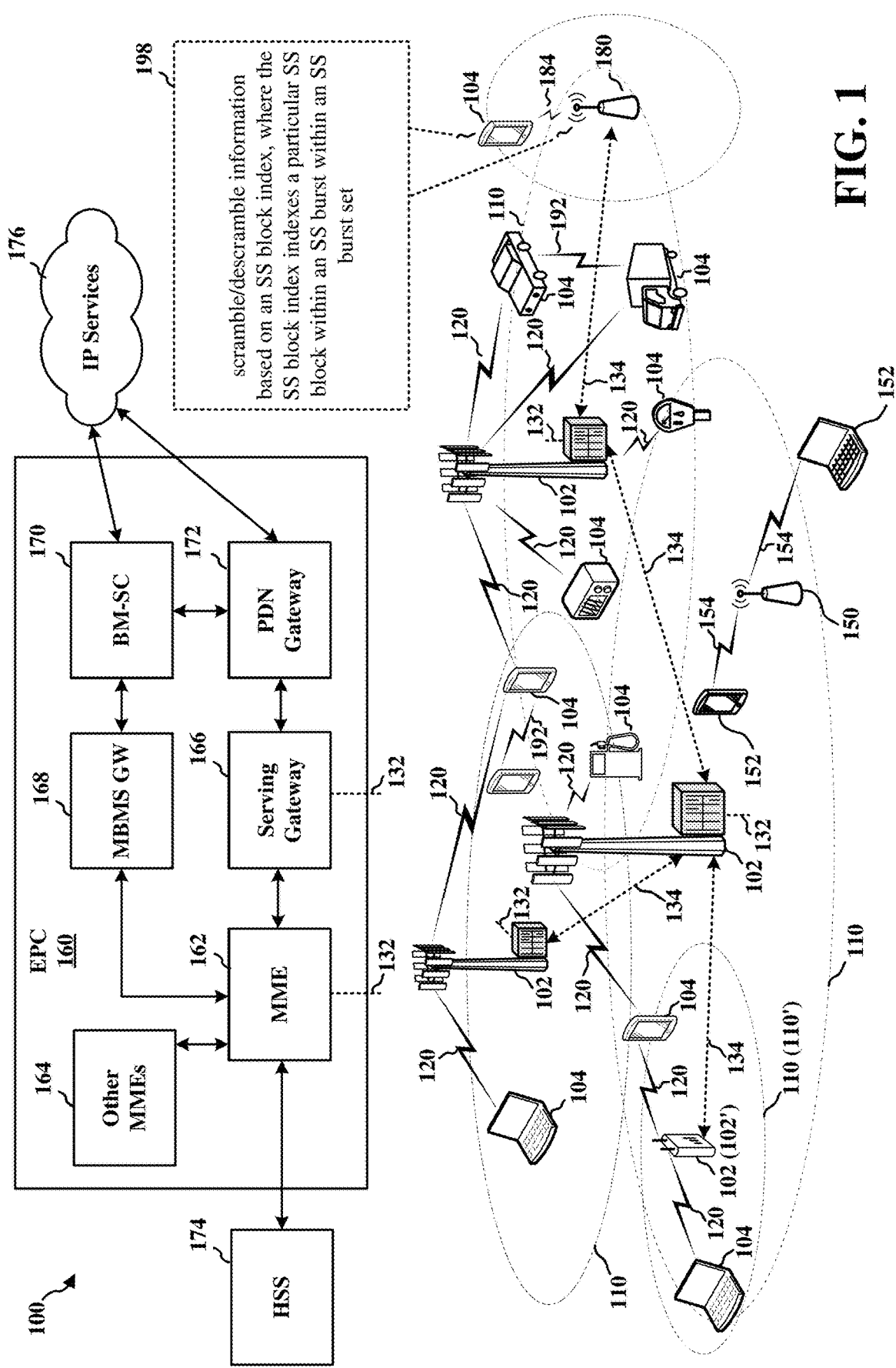
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 192. The D2D communication link 192 may use the DL/UL WWAN spectrum. The D2D communication link 192 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104/base station 180 may be configured to scramble/descramble information based on an SS block index (or any part or subset of the SS block index), where the SS block index indexes a particular SS block within an SS burst within an SS burst set (198). The information may be scrambled based on the SS block index before being transmitted and/or may be descrambled based on the SS block index after being received.

FIG. 2A is a diagram 200 illustrating an example of a DL subframe within a 5G/NR frame structure. FIG. 2B is a diagram 230 illustrating an example of channels within a DL subframe. FIG. 2C is a diagram 250 illustrating an example of an UL subframe within a 5G/NR frame structure. FIG. 2D is a diagram 280 illustrating an example of channels within an UL subframe. The 5G/NR frame structure may be FDD in which for a particular set of subcarriers (carrier system bandwidth), subframes within the set of subcarriers are dedicated for either DL or UL, or may be TDD in which for a particular set of subcarriers (carrier system bandwidth), subframes within the set of subcarriers are dedicated for both DL and UL. In the examples provided by FIGS. 2A, 2C, the 5G/NR frame structure is assumed to be TDD, with subframe 4 a DL subframe and subframe 7 an UL subframe. While subframe 4 is illustrated as providing just DL and subframe 7 is illustrated as providing just UL, any particular subframe may be split into different subsets that provide both UL and DL. Note that the description infra applies also to a 5G/NR frame structure that is FDD.

Other wireless communication technologies may have a different frame structure and/or different channels. A frame (10 ms) may be divided into 10 equally sized subframes (1 ms). Each subframe may include one or more time slots. Each slot may include 7 or 14 symbols, depending on the slot configuration. For slot configuration 0, each slot may include 14 symbols, and for slot configuration 1, each slot may include 7 symbols. The number of slots within a subframe is based on the slot configuration and the numerology. For slot configuration 0, different numerologies 0 to 5 allow for 1, 2, 4, 8, 16, and 32 slots, respectively, per subframe. For slot configuration 1, different numerologies 0 to 2 allow for 2, 4, and 8 slots, respectively, per subframe. The subcarrier spacing and symbol length/duration are a function of the numerology. The subcarrier spacing may be equal to $2^\mu * 15$ kKz, where $\mu$ is the numerology 0-5. The symbol length/duration is inversely related to the subcarrier spacing. FIGS. 2A, 2C provide an example of slot configuration 1 with 7 symbols per slot and numerology 0 with 2 slots per subframe. The subcarrier spacing is 15 kHz and symbol duration is approximately 66.7 µs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE (indicated as R). The RS may include demodulation RS (DMRS) and channel state information reference signals (CSI-RS) for channel estimation at the UE. The RS may also include beam measurement RS (BRS), beam refinement RS (BRRS), and phase-noise tracking RS (PT-RS).

FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE 104 to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS)/PBCH block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DMRS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
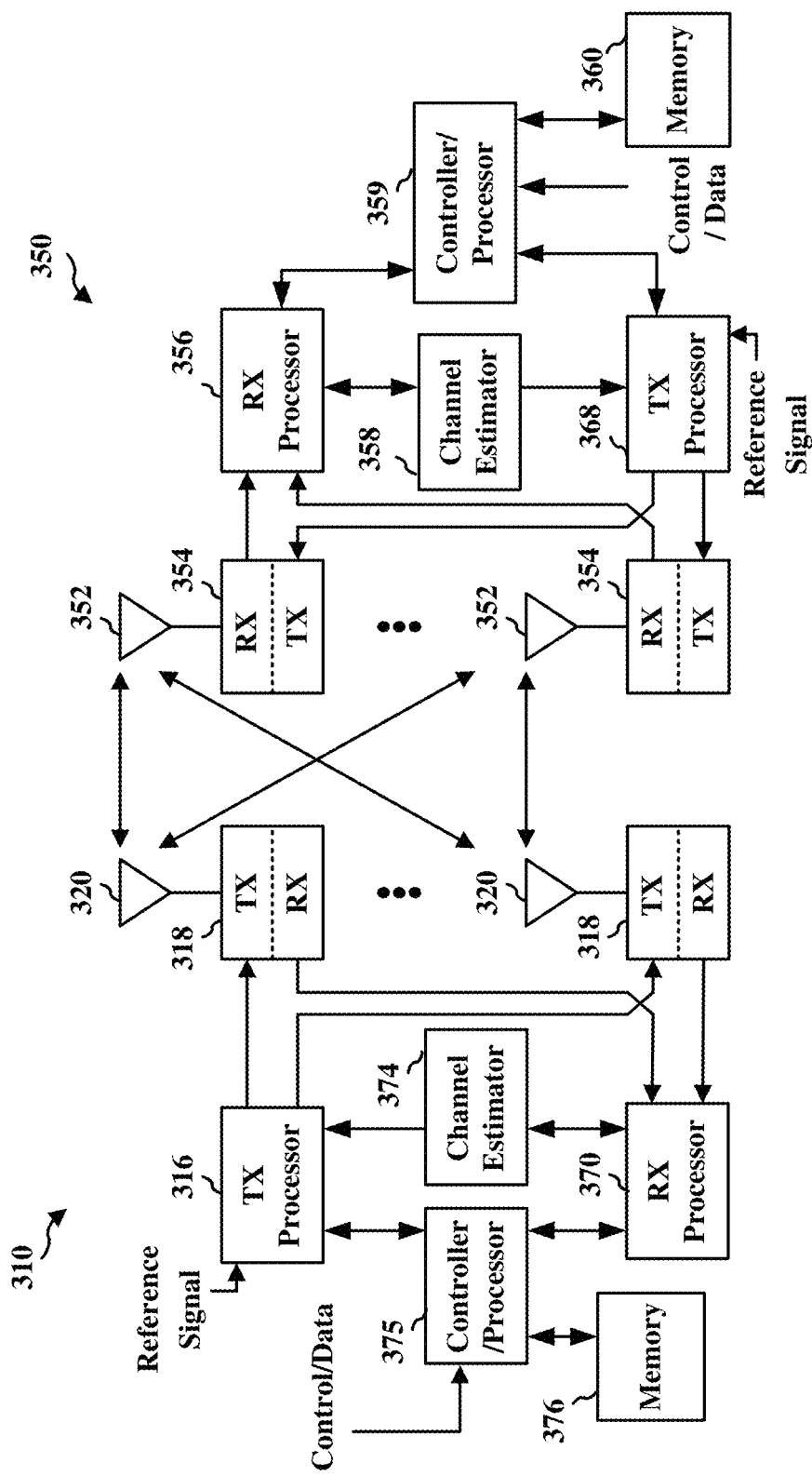
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Figure 4:
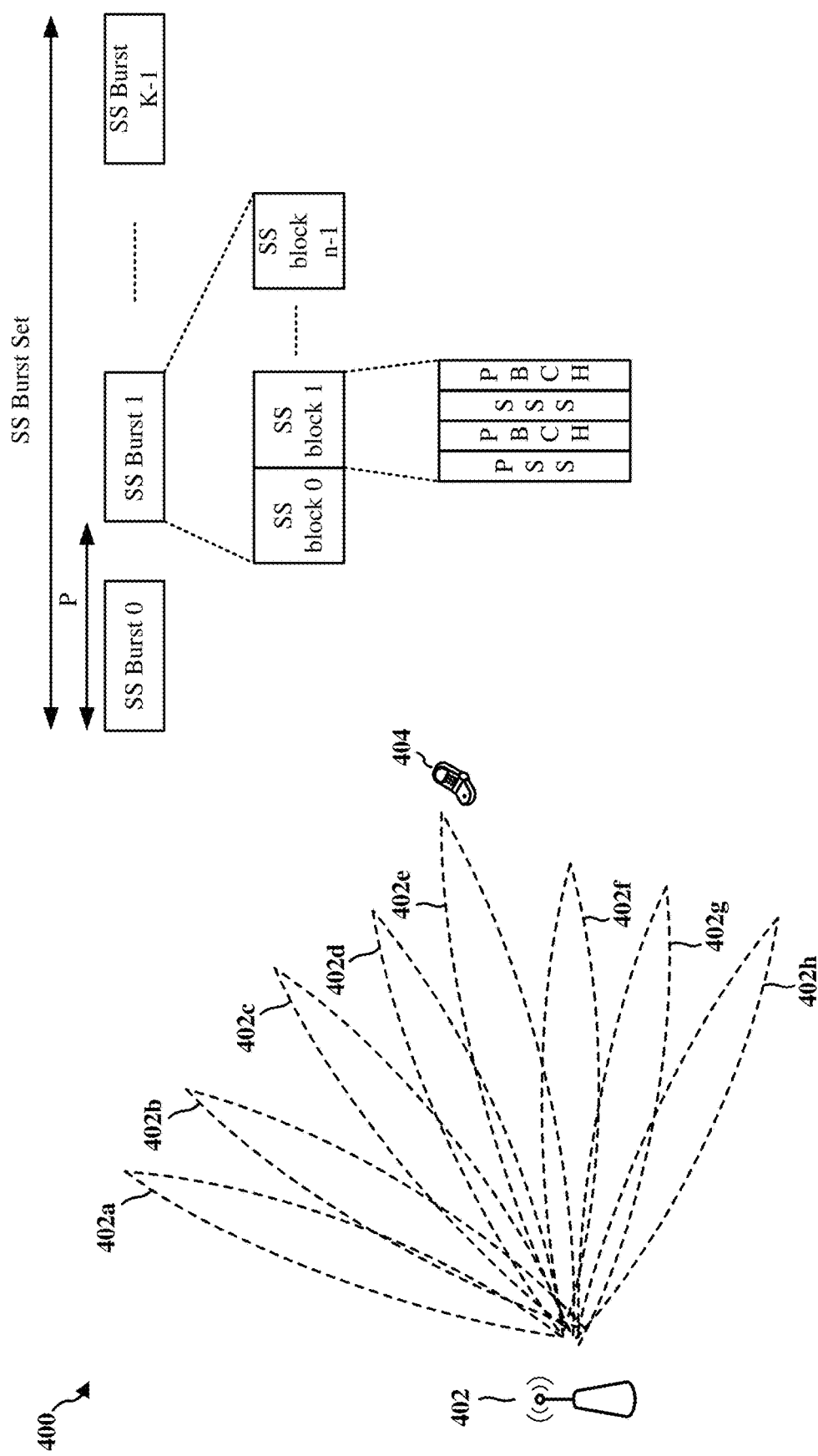
FIG. 4 is a diagram illustrating a base station in communication with a UE.

FIG. 4 is a diagram 400 illustrating a base station 402 in communication with a UE 404. Referring to FIG. 4, when the UE 404 turns on, the UE 404 searches for a nearby NR network. The UE 404 discovers the base station 402, which belongs to an NR network. The base station 402 transmits an SS block including the PSS, SSS, and the PBCH (including the MIB) periodically in different transmit directions 402a-402h. The UE 404 receives the transmission 402e including the PSS, SSS, and PBCH. Based on the received SS block, the UE 404 synchronizes to the NR network and camps on a cell associated with the base station 402.

As discussed supra, the PSS, SSS, and PBCH may be transmitted within an SS block. Each SS block has a corresponding SS block index (also referred to as SS/PBCH block index) indicated in FIG. 4 as one of 0, 1, ..., n−1. The PSS, SSS, and PBCH may be time division multiplexed and/or frequency division multiplexed with the SS block (FIG. 4 shows the PSS, SSS, and PBCH time division multiplexed within an SS block). While FIG. 4 shows the PSS, SSS, and PBCH as consecutive in time, the PSS, SSS, and PBCH may be non-consecutive in time, and therefore may be spaced from each other by one or more slots/symbols (i.e., may not be adjacent to each other in time). The SS block may include other signals/channels, and therefore other signals/channels other than the PSS, SSS, and PBCH may be multiplexed into the SS block. One or multiple SS blocks make up an SS burst. The number of SS blocks n in an SS burst may vary. SS blocks may or may not be consecutive with respect to the corresponding SS block index. SS blocks within an SS burst may or may not be the same. One or multiple SS bursts make up an SS burst set. The periodicity (period P) of SS bursts and the number of SS bursts in an SS burst set may vary. The number of SS bursts within an SS burst set is finite. The transmission of SS burst sets may be periodic or aperiodic.

FIG. 5A is a diagram 500 illustrating an example of an SS burst. FIG. 5B is a diagram 550 illustrating an example of SS bursts for different frequency bands/carriers. FIG. 6A is a diagram 600 illustrating a first example of an SS burst set. FIG. 6B is a diagram 650 illustrating a second example of an SS burst set. As illustrated in the diagram 500 of FIG. 5A, an SS burst includes a plurality of SS blocks corresponding to SS block indices 0, 1, . . . , 7. A subset 502 of the SS blocks (see indices 2, 5, in this example) may be preconfigured such that they may be off (i.e., not transmitted) to allow for transmission of an UL control block instead. As illustrated in the diagram 550 of FIG. 5B, different bands may have different SS burst configurations. For example, in band X, an SS burst may include SS blocks 0, 1, . . . , 7, with SS blocks 2, 5 being preconfigured for on/off to allow for transmission of an UL control block instead. For another example, in band Y, an SS burst may include SS blocks 0, 1, 3, 4, 6, 7 with SS blocks 1, 4, 7 being preconfigured for on/off to allow for transmission of an UL control block instead. The illustrated SS burst may be an $i^{th}$ SS burst within an SS burst set. As illustrated in the diagram 600 of FIG. 6A, in a first example, an SS burst set may include K different SS bursts 0, 1, . . . , K−1. The time length of the SS burst set may be N*10 ms, where N is an integer. Referring to FIG. 6B, the periodicity (period $P_1$) of an SS burst in an SS burst set is how often an SS burst is transmitted in an SS burst set. The periodicity of beam sweeping (period $P_2$) is how often a beam sweeping SS burst repeats itself in an SS burst set. A UE may use repetitive SS bursts in an SS burst set to filter a reference signal received power (RSRP) over time for the same beam direction and/or to train sub-arrays. In the example of FIG. 6B, the SS burst set has a time length of 80 ms, the periodicity $P_1$ of the SS burst is 20 ms, and the periodicity $P_2$ of beam sweeping is 40 ms.

As discussed supra, the SS block index may be used to indicate an SS block within an SS burst or within an SS burst set. When the SS block index is used to indicate an SS block within an SS burst, SS bursts may have an SS burst index to indicate the particular SS burst within an SS burst set. As such, an SS block index can indicate an SS block within an SS burst within an SS burst set (e.g., SS block indices are 0, 1, . . . , n*K−1 for SS blocks in an SS burst set, where there are n SS blocks per SS burst and K SS bursts in an SS burst set), or the combination of an SS block index and an SS burst index can indicate an SS block within an SS burst within an SS burst set (e.g., SS block indices are 0, 1, . . . , n−1 for SS blocks in each SS burst set, and SS burst indices are 0, 1, . . . , K−1 for SS bursts in an SS burst set). Herein, SS block index may refer to one or more indices for indicating an SS block within an SS burst within an SS burst set. A mapping function may be used to map an SS block index to a logic index. There may be a one to one mapping, with one SS block index mapped to one logic index. Alternatively, there may be a many to one mapping, with multiple SS block indices mapped to one logic index.

Figure 7:
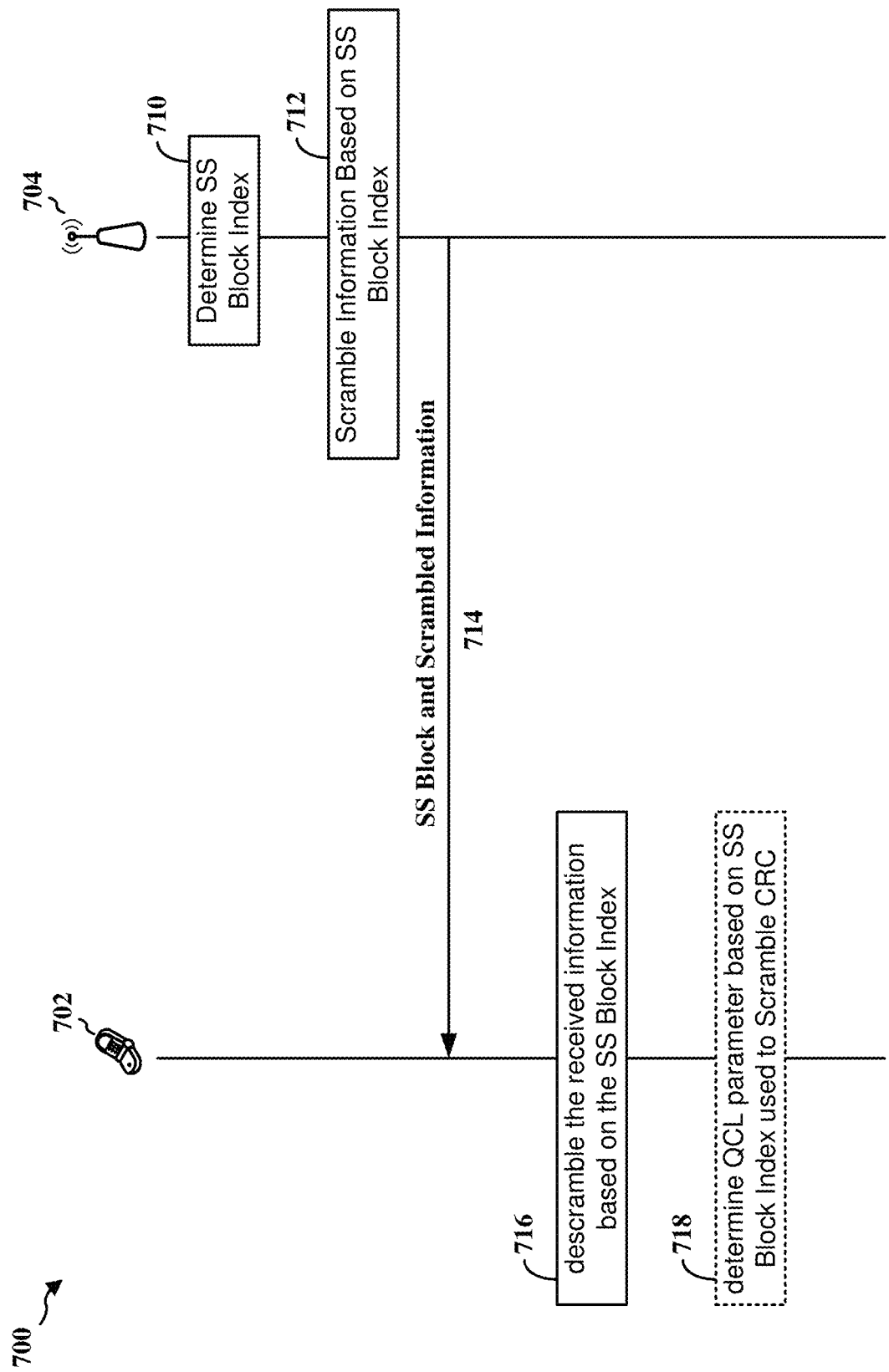
FIG. 7 is a diagram illustrating a first exemplary call-flow diagram for a UE and a base station.

FIG. 7 is a diagram 700 illustrating a first exemplary call-flow diagram for a UE 702 and a base station 704. As illustrated in FIG. 7, at 710, the base station 704 determines an SS block index associated with an SS block for transmission at 714. As discussed supra, the SS block may include at least one of a PSS, an SSS, or a PBCH. The base station 704 may determine the SS block index based on which SS block is being transmitted in a particular beam of a set of beams (see FIG. 4, 402a-402h). At 712, the base station 704 scrambles information based on the determined SS block index. The base station 704 may scramble the information by generating a scrambling sequence based on a sequence/scrambling initialization that is based at least in part on the SS block index. For example, the scrambling initialization for scrambling the information may be based on any subset of the SS block index. For another example, the scrambling initialization for scrambling the information may be based on both a subset of the SS block index and the cell ID of the base station 704 ($n_{ID}^{CELL}$). If the SS block index is m bits, the subset of the SS block index may include 1 to m bits. In one example, the subset of the SS block index may be X least significant bits (LSBs) of the SS block index, where X may be 2 or 3. In one example, the SS block index is 6 bits (e.g., $b_5b_4b_3b_2b_1b_0$) and the 3 LSBs (e.g., $b_2b_1b_0$) of the SS block index are used for the scrambling initialization for scrambling the information. The information before scrambling may be encoded and/or unencoded, and may be scrambled based on the generated scrambling sequence. The information includes at least one of a reference signal, data, paging information, control information, broadcast information, or a CRC associated with control information. In one configuration, the reference signal is at least one of CSI-RS, measurement RS (MRS) (also referred to as mobility RS), DMRS (for a PDCCH, a PDSCH, or a PBCH), or PT-RS. In one configuration, the data is for a PDSCH, the paging information is for a paging channel (PCH), the control information is for a PDCCH, and the broadcast information is for a PBCH. When the information includes a scrambled CRC, the control information associated with the scrambled CRC may or may not be scrambled itself based on the SS block index.

For example, the sequence initialization for scrambling DMRS (e.g., PBCH DMRS) may be based on the cell ID of the base station 704 and on the 3 LSBs of the SS block index. Specifically, the initialization for the PBCH DMRS may be $c_{init}=2^{11} \cdot (f_{SSB}+1) \cdot (\lfloor N_{ID}/4 \rfloor+1)+2^6 \cdot (f_{SSB}+1)+\mathrm{mod}(N_{ID}, 4)$, where $I_{SSB}$ is the SS block index, and where for max length L=4, $I_{SSB}=I_{SSB}+4HF$ where HF=0 in the first half frame of a radio frame and HF=1 in the second half frame of a radio frame, and for max length L=8, and max L=64, $f_{SSB}=I_{SSB}$.

For another example, assume the information is broadcast information for a PBCH. Before the encoding/CRC process, the base station 704 may scramble the PBCH payload based on a scrambling sequence that is based on the cell ID of the base station 704 (scrambling sequence initialization $C_{init}=N_{ID}^{cell}$). Subsequently, after the encoding/CRC process, the base station 704 may scramble the encoded PBCH based on a scrambling sequence that is based on its cell ID (scrambling sequence initialization $C_{init}=N_{ID}^{cell}$) and X LSBs of the SS block index. The X LSBs bits of the SS block index are used to determine a sequential non-overlapping portion of the sequence. The sequence may be a Gold sequence of length $M(2^X)$, where M is the number of bits to be scrambled. The sequence may be partitioned into $2^X$ non-overlapping portions. The X LSBs bits of the SS block index uniquely identify indices of each of the non-overlapping portion of the sequence, where X=2 for max length L=4, and X=3 for max length L=8 or 64. For X=3, the sequence index (e.g., $b_2b_1b_0$) used for each PBCH may be as follows (where M is the number of bits to be scrambled):

| (b2) | (b1) | (b0) | Sequence Index Used for Each PBCH |
|---|---|---|---|
| 0 | 0 | 0 | 0~M-1 |
| 0 | 0 | 1 | M~2M-1 |
| 0 | 1 | 0 | 2M~3M-1 |
| 0 | 1 | 1 | 3M~4M-1 |
| 1 | 0 | 0 | 4M~5M-1 |
| 1 | 0 | 1 | 5M~6M-1 |
| 1 | 1 | 0 | 6M~7M-1 |
| 1 | 1 | 1 | 7M~8M-1 |

At 714, the base station 704 transmits the SS block and the scrambled information to the UE 702. The SS block may include the scrambled information.

The base station 704 may use the SS block index to scramble a CRC when encoding a DL control payload. The base station 704 may use the scrambled CRC to convey a quasi-colocation (QCL) parameter for a control channel without explicit signaling. Two antenna ports are said to be quasi co-located if properties of the channel over which a symbol on one antenna port is conveyed can be inferred from the channel over which a symbol on the other antenna port is conveyed. QCL may support beam management functionality (at least including spatial parameters), frequency/timing offset estimation functionality (at least including Doppler/delay parameters), and radio resource management (RRM) functionality (at least including average gain). In NR, all or a subset of DMRS antenna ports may be quasi co-located. The conveyed QCL parameter may indicate QCL of reference signals associated with a beam pair including a beam associated with the control channel and the corresponding SS block index. By decoding the control channel and obtaining the SS block index, the UE 702 may be able to determine the QCL parameter associated with SS block index. The control channel may include a common control channel (CCCH) and/or a UE specific control channel (e.g., dedicated control channel (DCCH)). When the UE 702 decodes such DL control channel, the UE 702 may use the decoded DL control information or may discard the decoded DL control information depending on whether the UE 702 is configured to receive such control information scrambled by the SS block index. Referring again to 710, the base station 704 may determine an SS block to be used by the UE 702 in association with QCL of reference signals. In such a configuration, at 712, the base station 704 may generate a CRC based on control information to be transmitted to the UE 702, and may scramble the CRC based on the determined SS block index. At 714, the base station 704 may send the control information and the SS-block-index scrambled CRC to the UE 702.

At 714, the UE 702 receives the SS block including information scrambled based on the SS block index associated with the SS block.

At 716, the UE 702 descrambles the scrambled information based on the SS block index. The UE 702 may descramble the information itself based on the SS block index, or may descramble a CRC associated with the information based on the SS block index. In the latter case, the UE 702 may decode the information based on the descrambled CRC.

When the scrambled information 714 includes a CRC scrambled based on an SS block index, the UE 702 may descramble the CRC based on the SS block index, and decode received control information based on the descrambled CRC (e.g., decode received control information, generate a CRC based on the decoded control information, and compare the generated CRC to the descrambled CRC to determine whether the control information was decoded/descrambled successfully). Subsequently, at 718, the UE may determine a QCL parameter based on the SS block index used to descramble the CRC. As discussed supra, the QCL parameter may indicate QCL of reference signals associated with a beam pair including a beam associated with the control channel and the corresponding SS block index.

Figure 8:
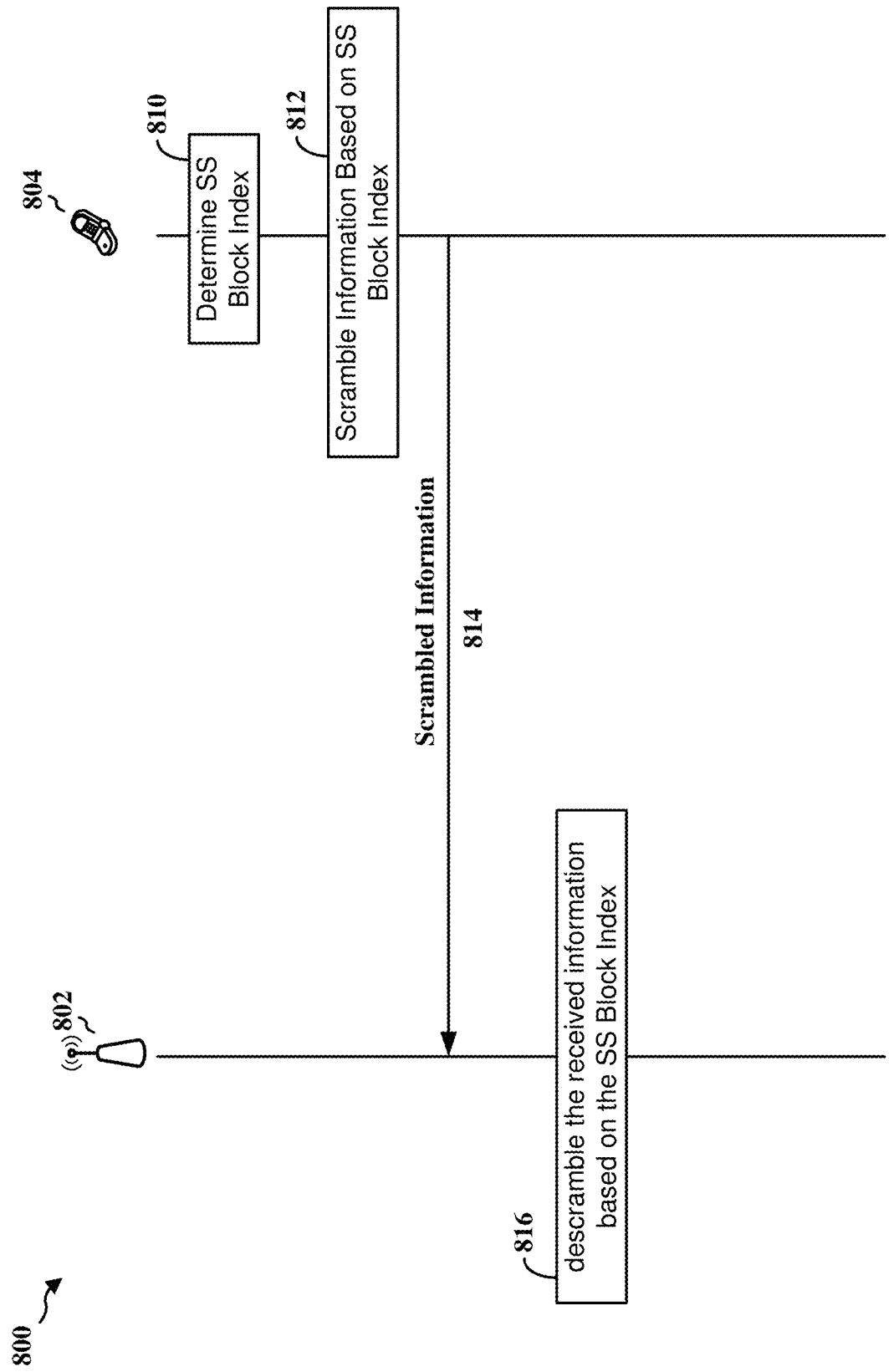
FIG. 8 is a diagram illustrating a second exemplary call-flow diagram for a UE and a base station.

FIG. 8 is a diagram 800 illustrating a second exemplary call-flow diagram for a UE and a base station. At 810, a UE 804 determines an SS block index associated with an SS block for reception. The SS block associated with the SS block index may have been previously received or may be received in the future. At 810, the UE 804 may receive an uplink grant from the base station 802, and may determine the SS block index based on the uplink grant. For example, if the UE receives an UL grant and an SS block in or associated with a beam, the UE may determine the SS block index to be the SS block index associated with the same beam as the UL grant. Alternatively, the UE 804 may receive, from the base station 802, information indicating the SS block index and, at 810, may determine the SS block index based on the received information.

At 812, the UE 804 scrambles information based on the determined SS block index. The UE 804 may scramble the information by generating a scrambling sequence based on a sequence initialization that is based at least in part on the SS block index. The information before scrambling may be encoded and/or unencoded, and may be scrambled based on the generated scrambling sequence. The information includes at least one of data, control information, or a CRC associated with control information. In one configuration, the data is for a PUSCH, and the control information is for a PUCCH.

At 814, the UE 804 transmits the scrambled information to a base station 802. When the scrambled information includes a CRC scrambled by the SS block index, the UE 804 may transmit UL control information along with the SS-block-index scrambled CRC. The base station 802 receives, from the UE, the information scrambled based on the SS block index.

At 816, the base station 802 descrambles the scrambled information based on the SS block index. When the scrambled information includes a CRC scrambled based on an SS block index, the base station 802 may descramble the CRC based on the SS block index, and decode the received UL control information based on the descrambled CRC (e.g., decode the received UL control information, generate a CRC based on the decoded UL control information, and compare the generated CRC to the descrambled CRC to determine whether the UL control information was decoded/descrambled successfully).

Figure 9:
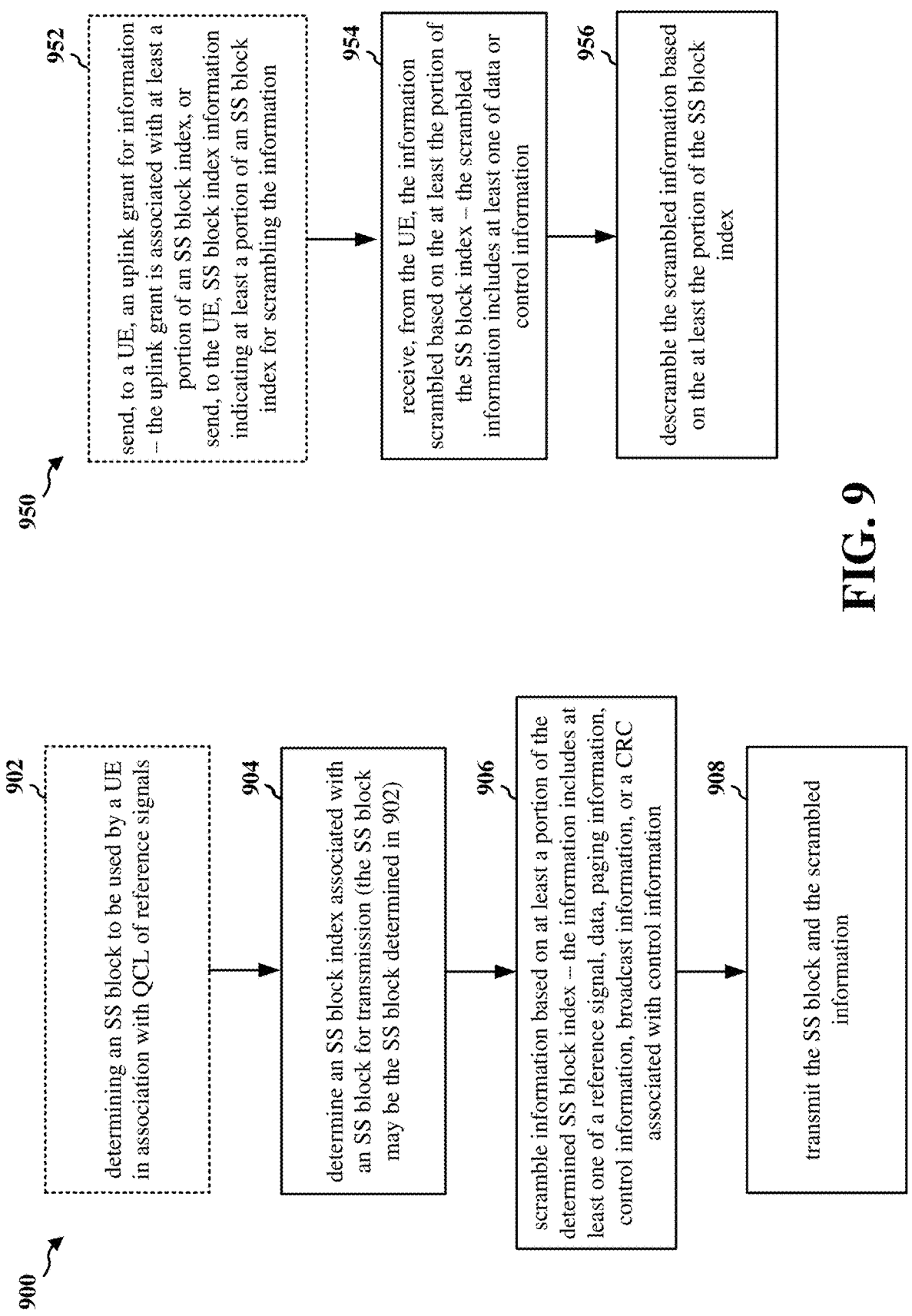
FIG. 9 illustrates flowcharts of methods of wireless communication of a base station.

FIG. 9 illustrates flowcharts 900, 950 of methods of wireless communication of a base station. With respect to the flow chart 900, at 904, a base station determines an SS block index associated with an SS block for transmission. As discussed supra in relation to FIG. 4, the SS block may include at least one of a PSS, an SSS, or a PBCH. If the base station transmits n SS blocks within an SS burst, and transmits K SS bursts within an SS burst set, the base station may determine the SS block index based on which SS block is being sent within a particular SS burst of an SS burst set. As such, the SS block index may be a function of n and K, as discussed supra in relation to FIGS. 6A, 6B. In one example, the SS block index $I_{SSB}$ may be one parameter within 0, 1, ..., n*K−1 for indicating the SS block within an SS burst within an SS burst set. In another example, the SS block index $I_{SSB}$ may be two parameters, with a first parameter between 0, 1, ..., n−1 (e.g., $s_2s_1s_0c_0$, if 4 bits with n=16) for indicating a particular SS block within an SS burst, and a second parameter between 0, 1, ..., K−1 (e.g., $b_5b_4b_3b_2b_1b_0$, if 6 bits with K=64) to indicate a particular SS burst within an SS burst set.

At 906, the base station scrambles information based on at least a portion of the determined SS block index $I_{SSB}$. The information may be scrambled based on a subset (a portion of) of the SS block index $I_{SSB}$, such as for example, X LSBs of the SS block index. The information includes at least one of a reference signal, data, paging information, control information, broadcast information, or a CRC associated with control information. The reference signal may be at least one of CSI-RS, MRS, DMRS (e.g., for a PDCCH, a PDSCH, or a PBCH), or PT-RS. In one configuration, the data is for a PDSCH, the paging information is for a PCH, the control information is for a PDCCH, and the broadcast information is for a PBCH. Using at least a portion of the determined SS block index $I_{SSB}$, the base station may scramble one or more of the various types of information. The base station may scramble the information by generating a scrambling sequence based on a sequence initialization that is based at least in part on the at least the portion of the SS block index. The information before scrambling may be encoded and/or unencoded, and may be scrambled based on the generated scrambling sequence.

In one configuration, the scrambled information includes the CRC scrambled based on the at least the portion of the SS block index, and the CRC is for control information sent to the UE. In such a configuration, at 902, the base station may determine an SS block to be used by a UE in association with QCL of reference signals. Further, at 906, the base station may scramble the CRC based on the at least the portion of the SS block index of the determined SS block in 902 to be used by the UE in association with QCL of reference signals.

At 908, the base station transmits the SS block and the scrambled information. The scrambled information may be transmitted with (concurrently in time with) or without (non-concurrently in time with) the SS block. For example, when the scrambled information is the PBCH, the scrambled PBCH is sent with the SS block. However, when the scrambled information is control information with a CRC, the scrambled control information with a CRC may not be transmitted concurrently in time with the SS block.

With respect to the flow chart 950, at 952, a base station may send, to a UE, an uplink grant for information, where the uplink grant is associated with an SS block index. Alternatively, the base station may send, to the UE, SS block index information indicating an SS block index for scrambling information.

At 954, the base station receives, from the UE, the information scrambled based on at least a portion of the SS block index. The scrambled information includes at least one of data or control information. In one configuration, the data is for a PUSCH, and the control information is for a PUCCH.

At 956, the base station descrambles the scrambled information based on the at least the portion of the SS block index. For example, the base station may receive information from the UE that is scrambled based on the at least the portion of the SS block index, and may descramble the received information based on the at least the portion of the SS block index. For another example, the base station may receive the information with a CRC scrambled based on the at least the portion of the SS block index. The base station may descramble the CRC received from the UE, decode the information, generate a CRC based on the decoded information, and compare the generated CRC to the descrambled CRC to determine whether the information received from the UE was decoded/descrambled successfully.

Figure 10:
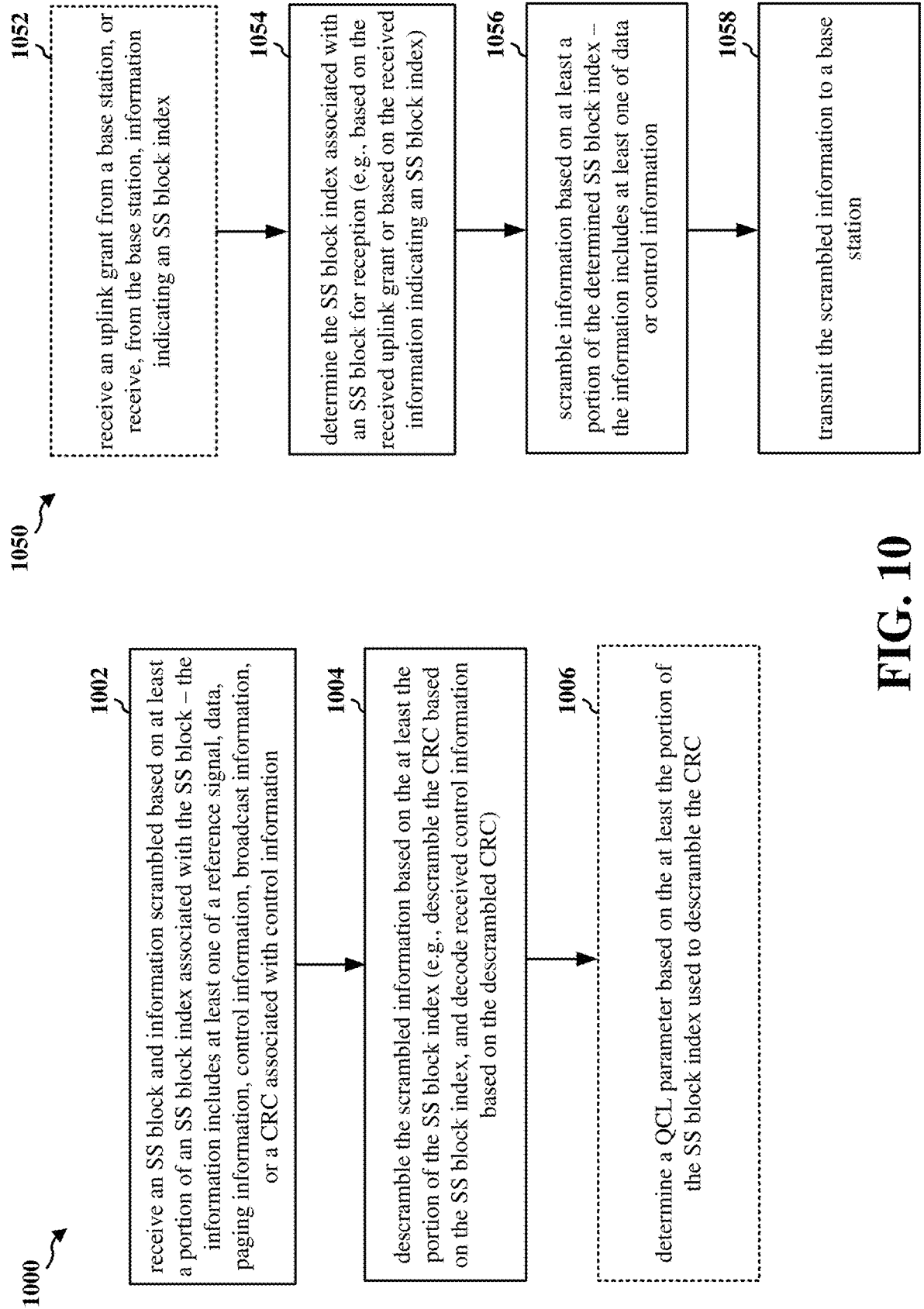
FIG. 10 illustrates flowcharts of methods of wireless communication of a UE.

FIG. 10 illustrates flowcharts 1000, 1050 of methods of wireless communication of a UE. With respect to the flow chart 1000, at 1002, a UE receives an SS block and information scrambled based on at least a portion of an SS block index associated with the SS block. As discussed in relation to FIG. 4, the SS block may include at least one of a PSS, an SSS, or a PBCH. The information includes at least one of a reference signal, data, paging information, control information, broadcast information, or a CRC associated with control information. In one configuration, the reference signal is at least one of CSI-RS, MRS, DMRS (e.g., for a PDCCH, a PDSCH, or a PBCH), or PT-RS. In one configuration, the data is for a PDSCH, the paging information is for a PCH, the control information is for a PDCCH, and the broadcast information is for a PBCH.

At 1004, the UE descrambles the scrambled information based on the at least the portion of the SS block index. In one configuration, the scrambled information includes a CRC scrambled based on the at least the portion of the SS block index. In such a configuration, at 1004, the UE descrambles the CRC based on the at least the portion of the SS block index, and decodes received control information based on the descrambled CRC.

In the configuration in which the UE descrambles the CRC based on the at least the portion of the SS block index and decodes received control information based on the descrambled CRC, at 1006, the UE may determine a QCL parameter based on the at least the portion of the SS block index used to descramble the CRC.

With respect to the flow chart 1050, at 1052, a UE may receive an uplink grant from a base station. Alternatively, the UE may receive, from the base station, information indicating an SS block index.

At 1054, the UE determines the SS block index associated with an SS block for reception. The UE may determine the SS block index based on the uplink grant, or otherwise, based on the information indicating an SS block index.

At 1056, the UE scrambles information based on at least a portion of the determined SS block index. The information includes at least one of data or control information. In one configuration, the data is for a PUSCH, and the control information is for a PUCCH. The UE may scramble the information itself and/or may scramble a CRC associated with the information. The UE may scramble the information by generating a scrambling sequence based on a sequence initialization that is based at least in part on the at least the portion of the SS block index. The information before scrambling may be at least one of encoded or unencoded, and may be scrambled based on the generated scrambling sequence.

At 1058, the UE transmits the scrambled information to a base station. The scrambled information may include the information scrambled based on the at least the portion of the SS block index, or may include both the information and a CRC (generated based on the information) that is scrambled based on the at least the portion of the SS block index.

Figure 11:
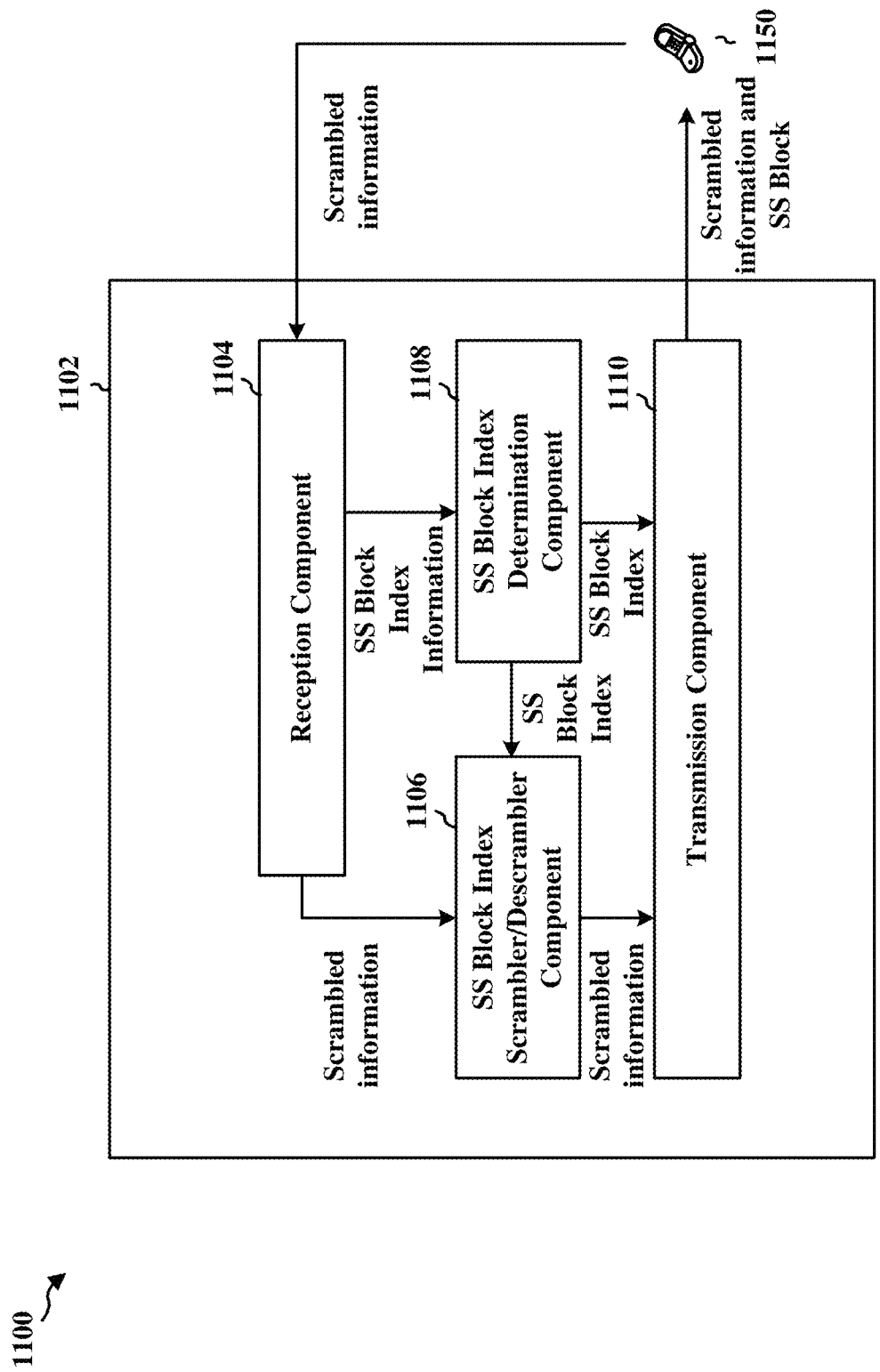
FIG. 11 is a conceptual data flow diagram illustrating the data flow between different means/components in an exemplary base station apparatus.

FIG. 11 is a conceptual data flow diagram 1100 illustrating the data flow between different means/components in an exemplary apparatus 1102. The apparatus may be a base station, such as the base station 180, 402, 704, 802. The apparatus includes an SS block index determination component 1108 that may be configured to determine an SS block index associated with an SS block for transmission. The SS block index determination component 1108 may provide the determined SS block index to an SS block index scrambler/descrambler component 1106. The SS block index scrambler/descrambler component 1106 may be configured to scramble information based on at least a portion of the determined SS block index. The information may include at least one of a reference signal, data, paging information, control information, broadcast information, or a CRC associated with control information. After scrambling the information, the SS block index scrambler/descrambler component 1106 may provide the scrambled information to a transmission component 1110. The transmission component 1110 may be configured to transmit the SS block and the scrambled information to a UE 1150.

As discussed supra, the reference signal may be at least one of CSI-RS, MRS, DMRS (e.g., for a PDCCH, a PDSCH, or a PBCH), or PT-RS. Further, the data may be for a PDSCH, the paging information may be for a PCH, the control information may be for a PDCCH, and the broadcast information may be for a PBCH. The SS block may include at least one of a PSS, an SSS, or a PBCH.

The scrambled information may include the CRC scrambled based on the at least the portion of the SS block index, where the CRC is for control information sent to the UE 1150. In such a configuration, the SS Block index determination component 1108 may be configured to determine an SS block to be used by the UE 1150 in association with QCL of reference signals, and the CRC may be scrambled based on the at least the portion of the SS block index of the determined SS block to be used by the UE 1150 in association with QCL of reference signals.

The SS block index scrambler/descrambler component 1106 may be configured to scramble the information by generating a scrambling sequence based on a sequence initialization that is based at least in part on the at least the portion of the SS block index. The information before scrambling may be at least one of encoded or unencoded, and may be scrambled based on the generated scrambling sequence.

The apparatus 1102 may further include a reception component 1104 that is configured to receive, from the UE 1150, information scrambled based on at least a portion of an SS block index, where the scrambled information includes at least one of data or control information. The reception component 1104 may provide the received scrambled information to the SS block index scrambler/descrambler component 1106. The reception component 1104 may also provide SS block index information associated with the received scrambled information to the SS block index determination component 1108 so that the SS block index determination component 1108 may determine an SS block index associated with the received scrambled information. In such case, the SS block index determination component 1108 may provide the SS block index associated with the received scrambled information to the SS block index scrambler/descrambler component 1106. The SS block index scrambler/descrambler component 1106 may be configured to descramble the scrambled information based on the at least the portion of the SS block index.

As discussed supra, the data may be for a PUSCH, and the control information may be for a PUCCH. The transmission component 1110 may be configured to send, to the UE 1150, an uplink grant for the information, wherein the uplink grant is associated with the SS block index. Alternatively, the SS block index determination component 1108 may provide an SS block index to the transmission component 1110, and the transmission component 1110 may send, to the UE 1150, SS block index information indicating the SS block index for scrambling the information. The SS block index scrambler/descrambler component 1106 may be configured to scramble the information by generating a scrambling sequence based on a sequence initialization that is based at least in part on at least a portion of the SS block index, where the information before scrambling is at least one of encoded or unencoded, and the information is scrambled based on the generated scrambling sequence.

The apparatus may include additional components that perform each of the blocks of the algorithm in the aforementioned flowcharts 900, 950 of FIG. 9. As such, each block in the aforementioned flowcharts 900, 950 of FIG. 9 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 12:
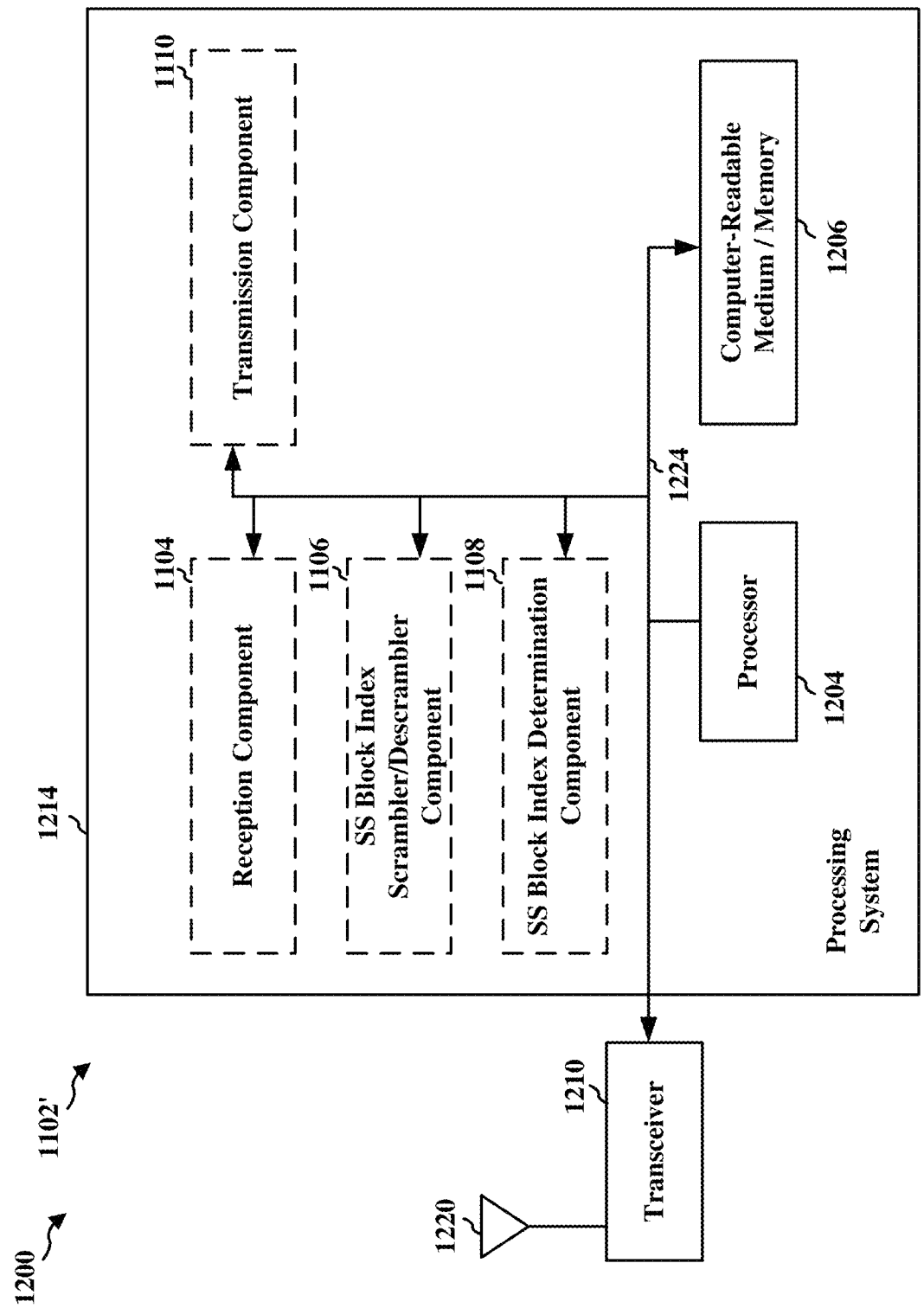
FIG. 12 is a diagram illustrating an example of a hardware implementation for a base station apparatus employing a processing system.

FIG. 12 is a diagram 1200 illustrating an example of a hardware implementation for an apparatus 1102' employing a processing system 1214. The processing system 1214 may be implemented with a bus architecture, represented generally by the bus 1224. The bus 1224 may include any number of interconnecting buses and bridges depending on the specific application of the processing system 1214 and the overall design constraints. The bus 1224 links together various circuits including one or more processors and/or hardware components, represented by the processor 1204, the components 1104, 1106, 1108, 1110 and the computer-readable medium/memory 1206. The bus 1224 may also link various other circuits such as timing sources, peripherals, voltage regulators, and power management circuits, which are well known in the art, and therefore, will not be described any further.

The processing system 1214 may be coupled to a transceiver 1210. The transceiver 1210 is coupled to one or more antennas 1220. The transceiver 1210 provides a means for communicating with various other apparatus over a transmission medium. The transceiver 1210 receives a signal from the one or more antennas 1220, extracts information from the received signal, and provides the extracted information to the processing system 1214, specifically the reception component 1104. In addition, the transceiver 1210 receives information from the processing system 1214, specifically the transmission component 1110, and based on the received information, generates a signal to be applied to the one or more antennas 1220. The processing system 1214 includes a processor 1204 coupled to a computer-readable medium/memory 1206. The processor 1204 is responsible for general processing, including the execution of software stored on the computer-readable medium/memory 1206. The software, when executed by the processor 1204, causes the processing system 1214 to perform the various functions described supra for any particular apparatus. The computer-readable medium/memory 1206 may also be used for storing data that is manipulated by the processor 1204 when executing software. The processing system 1214 further includes at least one of the components 1104, 1106, 1108, 1110. The components may be software components running in the processor 1204, resident/stored in the computer readable medium/memory 1206, one or more hardware components coupled to the processor 1204, or some combination thereof. The processing system 1214 may be a component of the base station 310 and may include the memory 376 and/or at least one of the TX processor 316, the RX processor 370, and the controller/processor 375.

In one configuration, the apparatus 1102/1102' for wireless communication is a base station and may include means for determining an SS block index associated with an SS block for transmission. The addition, the apparatus may include means for scrambling information based on at least a portion of the determined SS block index, where the information includes at least one of a reference signal, data, paging information, control information, broadcast information, or a CRC associated with control information. Further, the apparatus may include means for transmitting the SS block and the scrambled information. In one configuration, the scrambled information includes the CRC scrambled based on the at least the portion of the SS block index, and the CRC is for control information sent to the UE. In such a configuration, the apparatus may further include means for determining an SS block to be used by a UE in association with QCL of reference signals. The CRC may be scrambled based on the at least the portion of the SS block index of the determined SS block to be used by the UE in association with QCL of reference signals. In one configuration, the means for scrambling the information may be configured to generate a scrambling sequence based on a sequence initialization that is based at least in part on the at least the portion of the SS block index, where the information before scrambling is at least one of encoded or unencoded, and the information is scrambled based on the generated scrambling sequence.

In one configuration, the apparatus 1102/1102' for wireless communication is a base station and may include means for receiving, from a UE, information scrambled based on at least a portion of an SS block index, where the scrambled information includes at least one of data or control information. The apparatus may further include means for descrambling the scrambled information based on the at least the portion of the SS block index. In one configuration, the apparatus further includes means for sending, to the UE, an uplink grant for the information, where the uplink grant is associated with the SS block index. In one configuration, the apparatus may further include means for sending, to the UE, SS block index information indicating the SS block index for scrambling the information.

The aforementioned means may be one or more of the aforementioned components of the apparatus 1102 and/or the processing system 1214 of the apparatus 1102' configured to perform the functions recited by the aforementioned means. As described supra, the processing system 1214 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Figure 13:
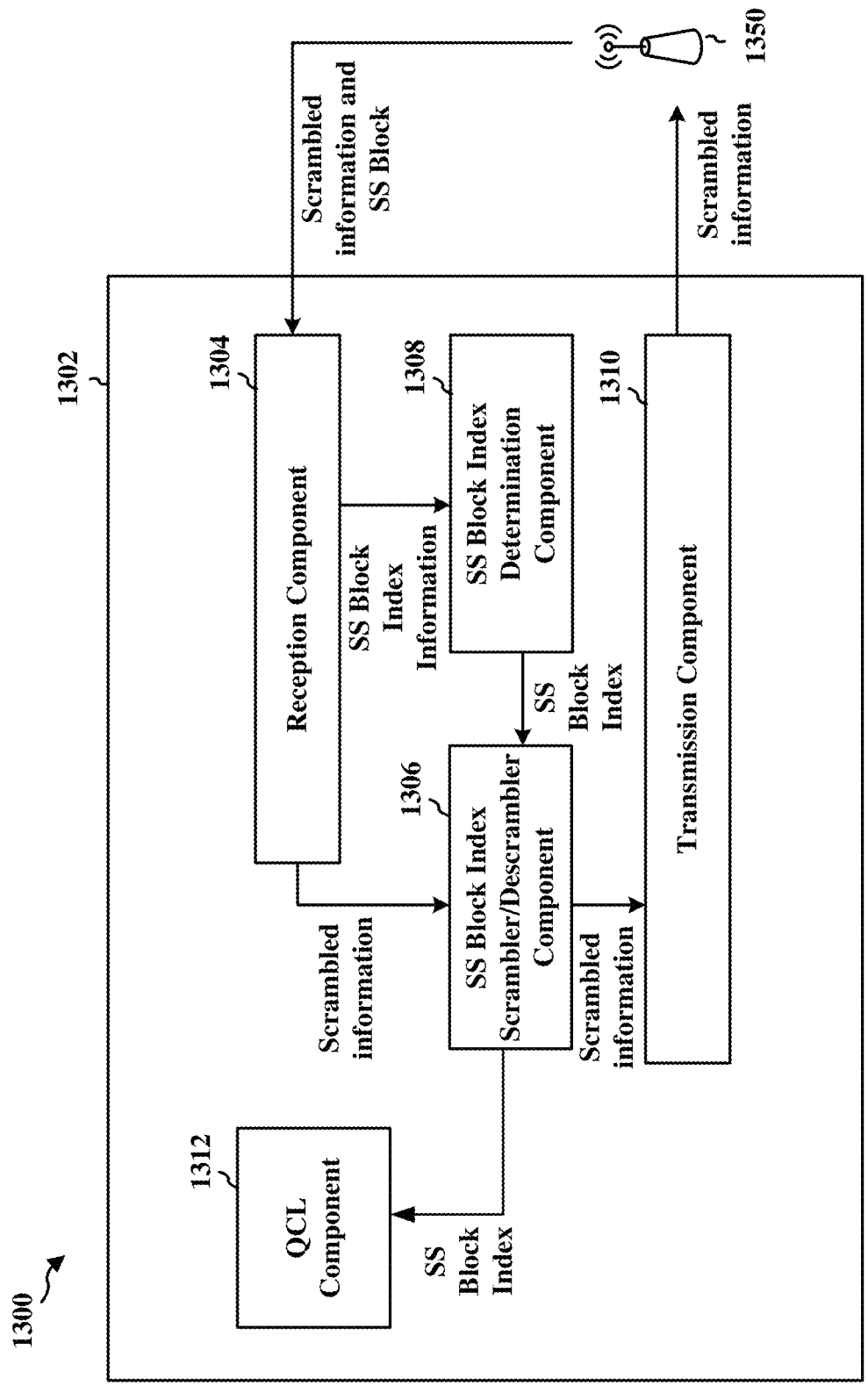
FIG. 13 is a conceptual data flow diagram illustrating the data flow between different means/components in an exemplary base station apparatus.

FIG. 13 is a conceptual data flow diagram 1300 illustrating the data flow between different means/components in an exemplary apparatus 1302. The apparatus may be a UE, such as the UE 104, 404, 702, 804. The apparatus includes a reception component 1304 configured to receive an SS block and information scrambled based on at least a portion of an SS block index associated with the SS block. The SS block may include at least one of a PSS, an SSS, or a PBCH. The information includes at least one of a reference signal, data, paging information, control information, broadcast information, or a CRC associated with control information. The reception component 1304 may provide the scrambled information to an SS block index scrambler/descrambler component 1306. The SS block index scrambler/descrambler component 1306 may be configured to descramble the scrambled information based on the at least the portion of the SS block index.

The reference signal may be at least one of CSI-RS, MRS, DMRS (e.g., for a PDCCH, a PDSCH, or a PBCH), or PT-RS. The data may be for a PDSCH, the paging information may be for a PCH, the control information may be for a PDCCH, and the broadcast information may be for a PBCH.

The scrambled information may include the CRC scrambled based on the at least the portion of the SS block index. In such a configuration, the SS block index scrambler/descrambler component 1306 may be configured to descramble the scrambled information based on the at least the portion of the SS block index by descrambling the CRC based on the at least the portion of the SS block index, and decoding received control information based on the descrambled CRC. The apparatus may further include a QCL component 1312 that is configured to determine a QCL parameter based on the at least the portion of the SS block index used to descramble the CRC.

The apparatus may further include an SS block index determination component 1308 that is configured to determine an SS block index associated with an SS block for reception. The SS block index determination component 1308 may receive SS block index information from the reception component 1304 in order to determine the SS block index. The SS block index determination component 1308 may provide the determined SS block index to an SS block index scrambler/descrambler component 1306. The SS block index scrambler/descrambler component 1306 may be configured to scramble information based on the at least the portion of the determined SS block index. The information may include at least one of data, control information, or a CRC associated with control information. The SS block index scrambler/descrambler component 1306 may provide the scrambled information to a transmission component 1310. The transmission component 1310 may be configured to transmit the scrambled information to a base station 1350.

The data may be for a PUSCH, and the control information may be for a PUCCH. The reception component 1304 may be configured to receive an uplink grant from the base station 1350. The SS block index determination component 1308 may determine the SS block index based on the uplink grant. Alternatively, the reception component 1304 may be configured to receive, from the base station 1350, SS block index information indicating the SS block index. The reception component 1304 may provide the SS block index information to the SS block index determination component 1308 so that the SS block index determination component 1308 may determine the SS block index. The SS block index scrambler/descrambler component 1306 may be configured to scramble the information by generating a scrambling sequence based on a sequence initialization that is based at least in part on the at least the portion of the SS block index.

The information before scrambling may be at least one of encoded or unencoded, and the information may be scrambled based on the generated scrambling sequence.

The apparatus may include additional components that perform each of the blocks of the algorithm in the aforementioned flowcharts of FIG. 10. As such, each block in the aforementioned flowcharts of FIG. 10 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 14:
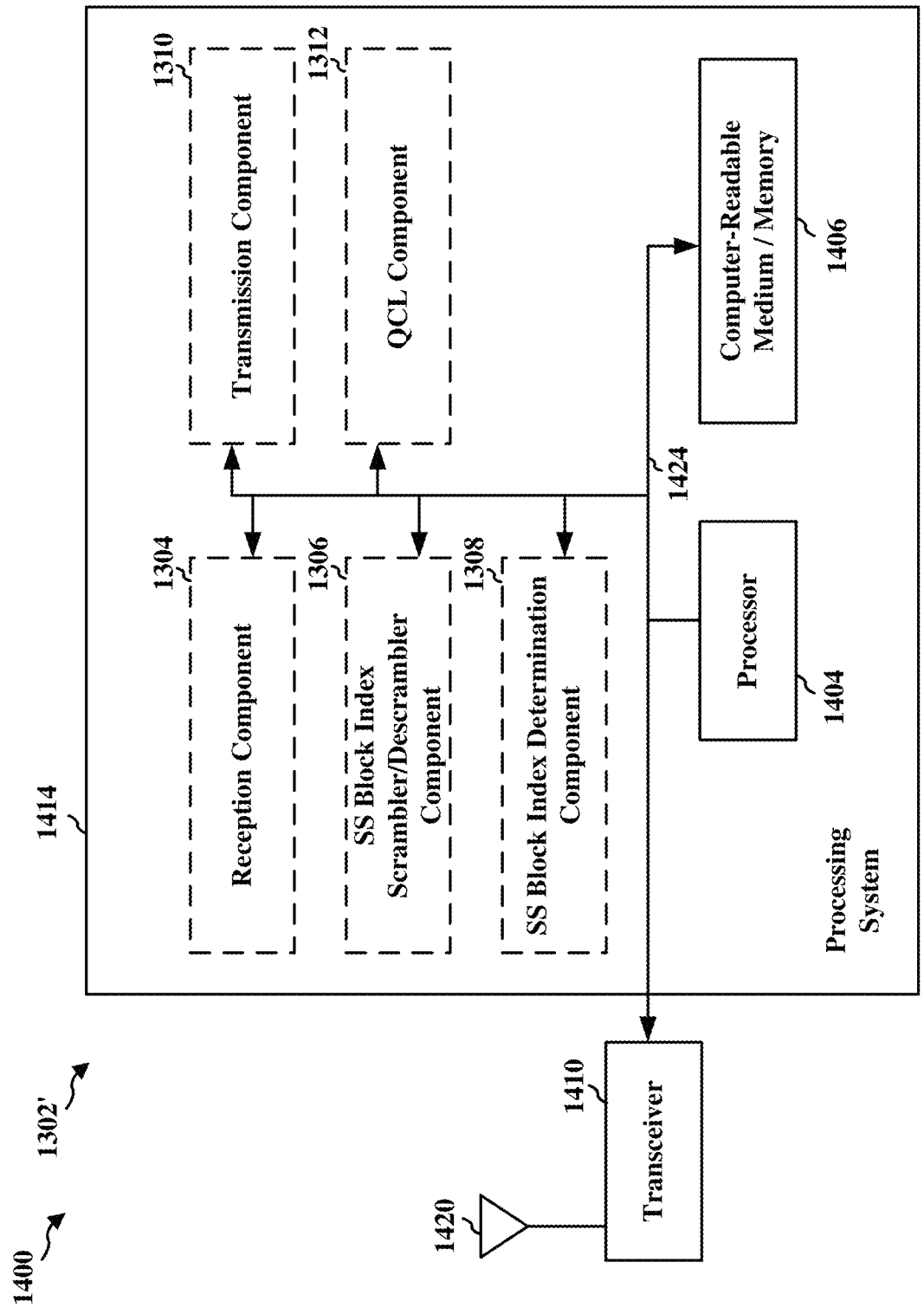
FIG. 14 is a diagram illustrating an example of a hardware implementation for a base station apparatus employing a processing system.

FIG. 14 is a diagram 1400 illustrating an example of a hardware implementation for an apparatus 1302' employing a processing system 1414. The processing system 1414 may be implemented with a bus architecture, represented generally by the bus 1424. The bus 1424 may include any number of interconnecting buses and bridges depending on the specific application of the processing system 1414 and the overall design constraints. The bus 1424 links together various circuits including one or more processors and/or hardware components, represented by the processor 1404, the components 1304, 1306, 1308, 1310, 1312 and the computer-readable medium/memory 1406. The bus 1424 may also link various other circuits such as timing sources, peripherals, voltage regulators, and power management circuits, which are well known in the art, and therefore, will not be described any further.

The processing system 1414 may be coupled to a transceiver 1410. The transceiver 1410 is coupled to one or more antennas 1420. The transceiver 1410 provides a means for communicating with various other apparatus over a transmission medium. The transceiver 1410 receives a signal from the one or more antennas 1420, extracts information from the received signal, and provides the extracted information to the processing system 1414, specifically the reception component 1304. In addition, the transceiver 1410 receives information from the processing system 1414, specifically the transmission component 1310, and based on the received information, generates a signal to be applied to the one or more antennas 1420. The processing system 1414 includes a processor 1404 coupled to a computer-readable medium/memory 1406. The processor 1404 is responsible for general processing, including the execution of software stored on the computer-readable medium/memory 1406. The software, when executed by the processor 1404, causes the processing system 1414 to perform the various functions described supra for any particular apparatus. The computer-readable medium/memory 1406 may also be used for storing data that is manipulated by the processor 1404 when executing software. The processing system 1414 further includes at least one of the components 1304, 1306, 1308, 1310, 1312. The components may be software components running in the processor 1404, resident/stored in the computer readable medium/memory 1406, one or more hardware components coupled to the processor 1404, or some combination thereof. The processing system 1414 may be a component of the UE 350 and may include the memory 360 and/or at least one of the TX processor 368, the RX processor 356, and the controller/processor 359.

In one configuration, the apparatus 1302/1302' for wireless communication is a UE and may include means for receiving an SS block and information scrambled based on at least a portion of an SS block index associated with the SS block. The information includes at least one of a reference signal, data, paging information, control information, broadcast information, or a CRC associated with control information. The apparatus may further include means for descrambling the scrambled information based on the at least the portion of the SS block index. In one configuration, the scrambled information includes the CRC scrambled based on the at least the portion of the SS block index, and the means for descrambling the scrambled information based on the at least the portion of the SS block index is configured to descramble the CRC based on the at least the portion of the SS block index, and to decode received control information based on the descrambled CRC. In such a configuration, the apparatus may further include means for determining a QCL parameter based on the at least the portion of the SS block index used to descramble the CRC.

In one configuration, the apparatus 1302/1302' for wireless communication is a UE and may include means for determining an SS block index associated with an SS block for reception. The apparatus may further include means for scrambling information based on at least a portion of the determined SS block index. The information may include at least one of data, control information, or a CRC associated with control information. The apparatus may further include means for transmitting the scrambled information to a base station.

In one configuration, the apparatus may further include means for receiving an uplink grant from the base station, where the SS block index is determined based on the uplink grant. In one configuration, the apparatus may further include means for receiving, from the base station, information indicating the SS block index. In one configuration, the means for scrambling the information may be configured to generate a scrambling sequence based on a sequence initialization that is based at least in part on at least a portion of the SS block index, where the information before scrambling is at least one of encoded or unencoded, and the information is scrambled based on the generated scrambling sequence.

The aforementioned means may be one or more of the aforementioned components of the apparatus 1302 and/or the processing system 1414 of the apparatus 1302' configured to perform the functions recited by the aforementioned means. As described supra, the processing system 1414 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

As discussed supra, a base station/UE may scramble/descramble information based on at least a portion (subset) of an SS block index, where the SS block index indexes a particular SS block within an SS burst within an SS burst set. The SS block index may be one or multiple values to indicate a particular SS block index within an SS burst within an SS burst set. The information may be scrambled before being transmitted or may be descrambled after being received. For a base station transmitting information, the information may be at least one of a reference signal, data, paging information, control information, broadcast information, or a CRC associated with control information. For a UE transmitting information, the information may be at least one of data, control information, or a CRC associated with control information.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication at a base station, comprising:
    determining a synchronization signal (SS) block index associated with an SS block, wherein the SS block index is based on an index of the SS block within an SS burst;
    scrambling information based on a SS block index portion, wherein the SS block index portion comprises a portion of the determined SS block index, the SS block index portion is comprised of x least significant bits of the determined SS block index, where x is based on a maximum length of the SS burst, and the information includes broadcast information associated with control information; and
    transmitting the SS block, wherein the SS Block includes the scrambled information.

2. The method of claim 1, wherein the information includes a reference signal (RS), the RS comprising at least one of channel state information (CSI) RS (CSI-RS), measurement RS (MRS), demodulation RS (DMRS), or a phase-noise tracking RS (PT-RS).

3. The method of claim 2, wherein the scrambled information comprises DMRS.

4. The method of claim 1, wherein the control information is associated with a physical downlink control channel (PDCCH).

5. The method of claim 1, wherein the scrambled information comprises broadcast information on a physical broadcast channel (PBCH).

6. The method of claim 1, wherein the SS block includes at least one of a primary synchronization signal (PSS), a secondary synchronization signal (SSS), or a physical broadcast channel (PBCH).

7. The method of claim 1, wherein x is 2 if the maximum length is 4, and x is 3 if the maximum length is 8 or 64.

8. A method of wireless communication at a user equipment (UE), comprising:
    receiving a synchronization signal (SS) block, the SS block including information scrambled based on a SS block index portion, wherein a SS block index is based on an index of the SS block within an SS burst, and the SS block index portion comprises a portion of the SS block index, the SS block index portion is comprised of x least significant bits of the SS block index where x is based on a maximum length of an SS burst, and the information includes broadcast information associated with control information; and
    descrambling the scrambled information based on the SS block index portion.

9. The method of claim 8, wherein the information includes a reference signal (RS) which is at least one of channel state information (CSI) RS (CSI-RS), measurement RS (MRS), demodulation RS (DMRS), or a phase-noise tracking RS (PT-RS).

10. The method of claim 9, wherein the scrambled information comprises DMRS.

11. The method of claim 8, wherein the control information is associated with a physical downlink control channel (PDCCH).

12. The method of claim 8, wherein the scrambled information comprises broadcast information on a physical broadcast channel (PBCH).

13. The method of claim 8, wherein the SS block includes at least one of a primary synchronization signal (PSS), a secondary synchronization signal (SSS), or a physical broadcast channel (PBCH).

14. The method of claim 8, wherein x is 2 if the maximum length is 4, and x is 3 if the maximum length is 8 or 64.

15. An apparatus for wireless communication at a base station, comprising:
    a memory; and
    at least one processor coupled to the memory and configured to:
    determine a synchronization signal (SS) block index associated with an SS block, wherein the SS block index is based on an index of the SS block within an SS burst;
    scramble information based on a SS block index portion, wherein the SS block index portion comprises a portion of the determined SS block index, the SS block index portion is comprised of x least significant bits of the determined SS block index, where x is based on a maximum length of the SS burst, and the information includes broadcast information associated with control information; and
    transmit the SS block, the SS block including the scrambled information.

16. The apparatus of claim 15, wherein the information includes a reference signal (RS) which is at least one of channel state information (CSI) RS (CSI-RS), measurement RS (MRS), demodulation RS (DMRS), or a phase-noise tracking RS (PT-RS).

17. The apparatus of claim 16, wherein the scrambled information comprises DMRS.

18. The apparatus of claim 15, wherein the control information is associated with a physical downlink control channel (PDCCH).

19. The apparatus of claim 15, wherein the scrambled information comprises broadcast information on a physical broadcast channel (PBCH).

20. The apparatus of claim 19, wherein the SS block includes at least one of a primary synchronization signal (PSS), a secondary synchronization signal (SSS), or a physical broadcast channel (PBCH).

21. The apparatus of claim 15, wherein x is 2 if the maximum length is 4, and x is 3 if the maximum length is 8 or 64.

22. An apparatus for wireless communication at a user equipment (UE), comprising:
   a memory; and
   at least one processor coupled to the memory and configured to:
   receive a synchronization signal (SS) block, the SS block including information scrambled based on a SS block index portion, wherein a SS block index is based on an index of the SS block within an SS burst, and the SS block index portion comprises a portion of the SS block index, the SS block index portion is comprised of x least significant bits of the SS block index, where x is based on a maximum length of an SS burst, and the information includes broadcast information associated with control information; and
   descramble the scrambled information based on the SS block index portion.

23. The apparatus of claim 22, wherein the information includes a reference signal (RS) which is at least one of channel state information (CSI) RS (CSI-RS), measurement RS (MRS), demodulation RS (DMRS), or a phase-noise tracking RS (PT-RS).

24. The apparatus of claim 23, wherein the scrambled information comprises DMRS.

25. The apparatus of claim 22, wherein the control information is associated with a physical downlink control channel (PDCCH).

26. The apparatus of claim 22, wherein the scrambled information comprises broadcast information on a physical broadcast channel (PBCH).

27. The apparatus of claim 22, wherein the SS block includes at least one of a primary synchronization signal (PSS), a secondary synchronization signal (SSS), or a physical broadcast channel (PBCH).

28. The apparatus of claim 22, wherein x is 2 if the maximum length is 4, and x is 3 if the maximum length is 8 or 64.

29. An apparatus for wireless communication at a base station, comprising:
   means for determining a synchronization signal (SS) block index associated with an SS block, wherein the SS block index is based on an index of the SS block within an SS burst;
   means for scrambling information based on a SS block index portion, wherein the SS block index portion comprises a portion of the determined SS block index, the SS block index portion is comprised of x least significant bits of the determined SS block index, where x is based on a maximum length of an SS burst, and the information includes broadcast information associated with control information; and
   means for transmitting the SS block, wherein the SS Block includes the scrambled information.

30. The apparatus of claim 29, wherein the control information is associated with a physical downlink control channel (PDCCH).

31. The apparatus of claim 29, wherein the scrambled information comprises broadcast information on a physical broadcast channel (PBCH).

32. The apparatus of claim 29, wherein x is 2 if the maximum length is 4, and x is 3 if the maximum length is 8 or 64.

33. An apparatus for wireless communication at a user equipment (UE), comprising:
   means for receiving a synchronization signal (SS) block, the SS block including information scrambled based on a SS block index portion, wherein a SS block index is based on an index of the SS block within an SS burst, and the SS block index portion comprises a portion of the SS block index, the SS block index portion is comprised of x least significant bits of the SS block index, where x is based on a maximum length of an SS burst, and the information includes broadcast information associated with control information; and
   means for descrambling the scrambled information based on the SS block index portion.

34. The apparatus of claim 33, wherein the control information is associated with a physical downlink control channel (PDCCH).

35. The apparatus of claim 33, wherein the scrambled information comprises broadcast information on a physical broadcast channel (PBCH).

36. The apparatus of claim 33, wherein x is 2 if the maximum length is 4, and x is 3 if the maximum length is 8 or 64.

37. A non-transitory computer readable medium storing code for wireless communication, the code comprising instructions executable by a processor to:
   determine a synchronization signal (SS) block index associated with an SS block, wherein the SS block index is based on an index of the SS block within an SS burst;
   scramble information based on a SS block index portion, wherein the SS block index portion comprises a portion of the determined SS block index, the SS block index portion is comprised of x least significant bits of the determined SS block index, where x is based on a maximum length of an SS burst, and the information includes broadcast information associated with control information; and
   transmit the SS block, wherein the SS Block includes the scrambled information.

38. A non-transitory computer readable medium storing code for wireless communication, the code comprising instructions executable by a processor to:
   receive a synchronization signal (SS) block, the SS block including information scrambled based on a SS block index portion, wherein a SS block index is based on an index of the SS block within an SS burst, and the SS block index block portion comprises a portion of the SS block index, the SS block index portion is comprised of x least significant bits of the SS block index, where x is based on a maximum length of an SS burst, and the information includes broadcast information associated with control information; and descramble the scrambled information based on the SS block index portion.

* * * * *